(12) United States Patent
Hegde

(10) Patent No.: US 6,505,680 B1
(45) Date of Patent: Jan. 14, 2003

(54) HIGH PERFORMANCE COOLING DEVICE

(75) Inventor: Shankar Hegde, Annassandrapalya Bangalore (IN)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/916,932

(22) Filed: Jul. 27, 2001

(51) Int. Cl.[7] .............................. F28F 7/00; F28F 13/12; F28H 3/02; H05K 7/20
(52) U.S. Cl. ........................ 165/80.3; 165/121; 165/125; 361/697
(58) Field of Search .............................. 165/80.3, 121, 165/125, 185; 361/697, 709, 710; 257/722; 174/16.3

(56) References Cited

U.S. PATENT DOCUMENTS

| | | | |
|---|---|---|---|
| 4,733,293 A | * 3/1988 | Gabuzda ..................... | 165/80.3 |
| 5,288,203 A | 2/1994 | Thomas | |
| 5,377,745 A | 1/1995 | Hsieh | |
| 5,597,034 A | * 1/1997 | Barker, III et al. ......... | 165/80.3 |
| 5,661,638 A | * 8/1997 | Ali .............................. | 361/697 |
| 5,785,116 A | 7/1998 | Wagner | |
| 5,946,190 A | 8/1999 | Patel et al. | |
| 5,975,194 A | 11/1999 | Wagner | |
| D428,857 S | 8/2000 | Wagner et al. | |
| 6,109,340 A | 8/2000 | Nakase et al. | |
| 6,118,658 A | 9/2000 | Nakase | |
| 6,134,108 A | 10/2000 | Patel et al. | |
| 6,152,214 A | 11/2000 | Wagner | |
| 6,157,539 A | 12/2000 | Wagner et al. | |
| 6,176,299 B1 | 1/2001 | Hanzlik et al. | |
| 6,206,087 B1 | 3/2001 | Nakase et al. | |
| 6,259,601 B1 | 7/2001 | Jaggers et al. | |
| 6,336,499 B1 | * 1/2002 | Hong ......................... | 165/80.3 |
| 6,404,634 B1 | * 6/2002 | Mann ......................... | 165/121 |
| 6,419,007 B1 | * 7/2002 | Ogawara et al. .......... | 165/80.3 |

OTHER PUBLICATIONS

Alpha PEP66T with Delta Thin Fan Joe Citarelia—Dec. 12, 2000.

* cited by examiner

*Primary Examiner*—Henry Bennett
*Assistant Examiner*—Tho V Duong
(74) *Attorney, Agent, or Firm*—Trueman H. Denny, III

(57) ABSTRACT

A low-cost, fan assisted cooling device is disclosed. The cooling device includes a narrow bottom and broad top shape to optimize a material versus performance ratio. A plurality of vanes surround a central heat mass and an inside surface of the vanes define a chamber that surrounds the heat mass. A portion of each vane is split into a plurality of fins and both the vanes and the fins have a surface area that increase in a radially outward direction from an axis of the heat mass. The heat mass includes a boss that is surrounded by a groove. Both the boss and the grove have arcuate surface profiles. The vanes, the fins, the boss, and the groove efficiently dissipate heat when a fan or the like forces air into the chamber thereby producing air flows in three different directions. In a first direction, the air flows out of the chamber through the vanes. In a second direction, a low pressure region in the chamber induces air from outside the chamber to flow through the fins. In a third direction, the low pressure region induces an airflow over the groove and boss. Openings between the vanes are angled and offset from an orientation of the fans blades to minimize the airflow shock losses thereby reducing fan noise. The vanes and the fins can be homogeneously formed with the heat mass.

25 Claims, 19 Drawing Sheets

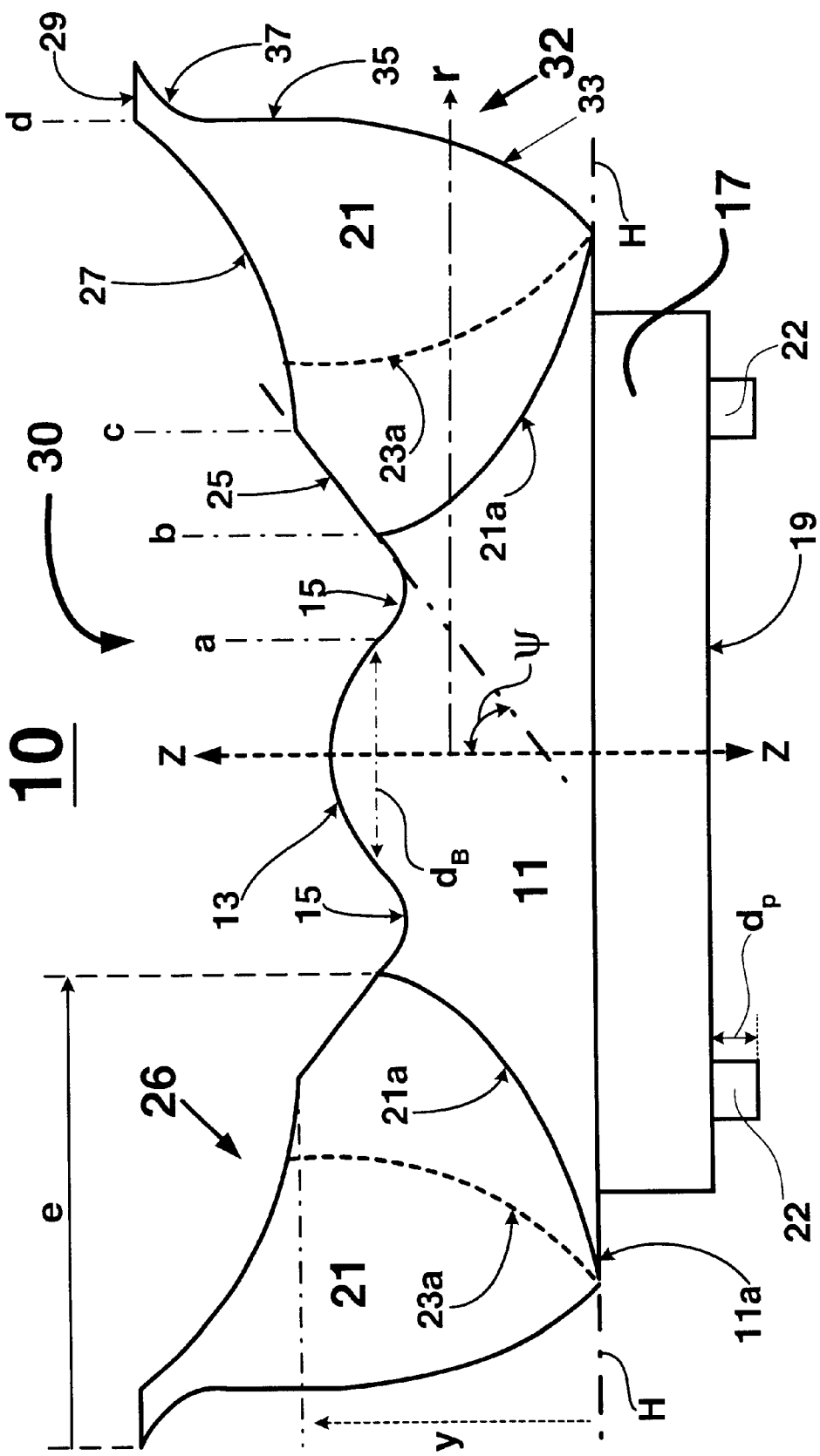

HIGH PERFORMANCE COOLING DEVICE

FIELD OF THE INVENTION

The present invention relates generally to a cooling device for removing heat from a component connected with the cooling device. More specifically, the present invention relates to a cooling device for removing heat from an electronic component connected with the cooling device.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors (μP), digital signal processors (DSP), and application specific integrated circuits (ASIC), the amount of waste heat generated by those electronic devices and the operating temperature of those electronic devices are directly proportional to clock speed. Therefore, higher clock speeds result in increased waste heat generation which in turn increases the operating temperature of the electronic device. However, efficient operation of the electronic device requires that waste heat be continuously and effectively removed.

Heat sink devices came into common use as a preferred means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. Alternatively, the heat sink is mounted to a PC board that carries the electronic device and fasteners or the like are used to connect the heat sink to the PC board via holes that are drilled in the PC board.

The need to drill holes can be one disadvantage to using fasteners because the fasteners or other mounting hardware used for connecting the heat sink to the PC board are usually electrically conductive and there is a risk of an electrical short due to contact between a PC board trace and the mounting hardware. Moreover, to avoid electrical shorts, the PC board traces can be routed around the hole, but that routing requires keep out zones that can complicate the routing of the traces.

Typically, a heat sink used in conjunction with a modern high clock speed electronic device will use an electrical fan mounted on top of the heat sink or within a cavity formed by cooling fins/vanes of the heat sink. The cooling fins increase the surface area of the heat sink and maximize heat transfer from the heat sink to ambient air that surrounds the heat sink. The fan causes air to circulate over and around the cooling fins thereby transferring heat from the cooling fins into the ambient air.

As mentioned previously, with continuing increases in clock speed, the amount of waste heat generated by electronic devices has also increased. Accordingly, to adequately cool those electronic devices, larger heat sinks and/or larger fans are required. Increasing the size of the heat sink results in a greater thermal mass and a greater surface area from which the heat can be dissipated. Increases in fan size provide for more air flow through the cooling fins.

There are disadvantages to increased fan and heat sink size. First, if the size of the heat sink is increased in a vertical direction (i.e. in a direction transverse to the PC board), then the heat sink is tall and may not fit within a vertical space in many applications, such as the chassis of a desktop computer. Second, if the PC board has a vertical orientation, then a heavy and tall heat sink can mechanically stress the PC board and/or the electronic device resulting in a device or PC board failure.

Third, a tall heat sink will require additional vertical clearance between the heat sink and a chassis the heat sink is contained in to allow for adequate air flow into or out of the fan. Fourth, if the heat sinks size is increased in a horizontal direction, then the amount of area available on the PC board for mounting other electronic devices is limited. Fifth, when the heat sink has a cylindrical shape formed by the fins it is often not possible to mount several such heat sinks in close proximity to each other because air flow into and out of the fins is blocked by adjacent heat sinks with a resulting decrease in cooling efficiency.

Finally, increases in fan size to increase cooling capacity often result in increased noise generation by the fan. In many applications such as the desktop computer or a portable computer, it is highly desirable to minimize noise generation. In portable applications that depend on a battery to supply power, the increased power drain of a larger fan is not an acceptable solution for removing waste heat.

In the above mentioned heat sink with cooling fins there are additional disadvantages to mounting the fan within a cavity formed by the fins. First, a substantial portion of a heat mass of the heat sink is partially blocked by the fan because the fan is mounted directly on the heat mass and therefore blocks a potential path for heat dissipation from the heat mass because air from the fan does not circulate over the blocked portion of the heat mass.

Second, without the fan, a depth of the fins could extend all the way to a center of the heat mass; however, the depth and surface area of the fins is reduced by a diameter of the fan because the fan is mounted in a cavity having a diameter that is slightly larger than the fans diameter to provide clearance for the fans blades. Consequently, the heat mass of the heat sink must be made broader to compensate for the reduced surface area of the fins. The broader heat mass increases the size, cost, and weight of the heat sink.

Third, the reduced depth of the fins makes it easier for the fins to be bent if damaged. One possible consequence of a bent fin is that it will contact and damage the fan blades and/or cause the fan to stall thereby damaging the fan or causing the fan to fail. Fourth, because the fan is mounted in the cavity formed by the fins, power leads for the fan must be routed through a space between the fins. Sharp edges on the fins can cut the power leads or cause an electrical short. In either case, the result is that the fan will fail. Fifth, glue is typically used to mount the fan to the heat sink and the glue can get into the fan and cause the fan to fail. Any of the above mentioned fan failure modes can lead to a failure of the electronic device the heat sink was designed to cool because air circulation generated by the fan is essential to effectively dissipate waste heat from the electronic device.

Thus, there exists a need for a cooling device that overcomes the aforementioned disadvantages associated with fan assisted heat sinks.

SUMMARY OF THE INVENTION

Broadly, the present invention is embodied in a cooling device for dissipating waste heat from a component to be cooled. The cooling device includes a heat mass with an arcuate boss that is surrounded by an arcuate groove. A heat conductive base including a mounting surface for connecting the cooling device with the component to be cooled is connected with the heat mass. Extending from the heat mass are a plurality of vanes that are spaced apart from each other to define a primary slot between adjacent vanes and extending to the heat mass. The vanes have a surface area that increases in a radially outward direction from an axis of the heat mass and a portion of the surface area of the vanes also increase in a direction that is along the axis. The vanes include a top face upon which a fan can be mounted, an aerodynamically profiled inner wall that defines a chamber that surrounds the boss and the groove, and an outer wall including a surface profile that widens from the base to the top face and includes a smooth curved portion, a draft portion, and a smooth radially outward portion. Furthermore, the surface area of the vanes is increased by a plurality of fins formed in each vane by a secondary slot extending through a portion of the vane.

An air flow entering the chamber creates a three-dimensional air flow that dissipates heat from the cooling device. First, the air flow exits through the vanes and a portion of the fins in an exhaust flow that dissipates heat from the vanes and the fins. Second, the exhaust flow creates a low pressure region within the chamber that induces an intake flow into the chamber through a major portion of the fins and a top portion of the vanes thereby dissipating heat from the fins and the vanes. Third, the low pressure region induces a surface flow along the inner wall so that the surface flow wets the groove and the boss as it passes over the groove and the boss to dissipate heat from the heat mass.

The cooling device of the present invention solves the aforementioned disadvantages of prior heat sinks. The cooling device can be mounted to a component to be cooled by using a clip to connect the cooling device with a connector that carries the component. Therefore, holes need not be drilled in a PC board to mount the cooling device. The cooling device employs vanes that extend deep within the heat mass and the surface area of the vanes increases from a bottom of the cooling device to a top of the cooling device and in a radially outward direction from the heat mass. Furthermore, each vane is split into at least two fins thus further increasing the surface area available for cooling. As a result, the cooling device need not be made taller to increase vane surface area and the cooling device need not be made wider to increase the size of the heat mass.

The top of the cooling device is adapted to mount a fan so that the heat mass is not blocked by the fan and air can circulate over the heat mass thus further dissipating heat from the cooling device. The fan can include a shroud that surrounds the blades unlike the fans that are mounted in a cavity formed by fins of prior heat sink devices. However, the cooling device can also mount a fan without a shroud using a clip or space frame to mount the fan to the top of the cooling device. Because the fan is mounted on top of the cooling device, the wires of the power leads for the fan are not routed through the vanes or fins thereby eliminating the risk of the wires being cut or short circuited.

The shape of the cooling device (wider at the top than at the bottom) allows for several of the cooling devices to be placed adjacent to each other without blocking air flow into and out of the vanes and fins.

The vanes of the cooling device can be tangentially oriented with a circle centered on an axis of the heat mass and the vanes can be inclined at an angle with respect to the axis such that the angle of inclination substantially matches or closely approximates a pitch angle of the blades of a fan. The tangential orientation and the inclination of the vanes reduces fan noise due to air shock losses.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1 is a cross-sectional view along line A—A of FIG. 2a of a cooling device according to the present invention.

DETAILED DESCRIPTION

Figure 2A:
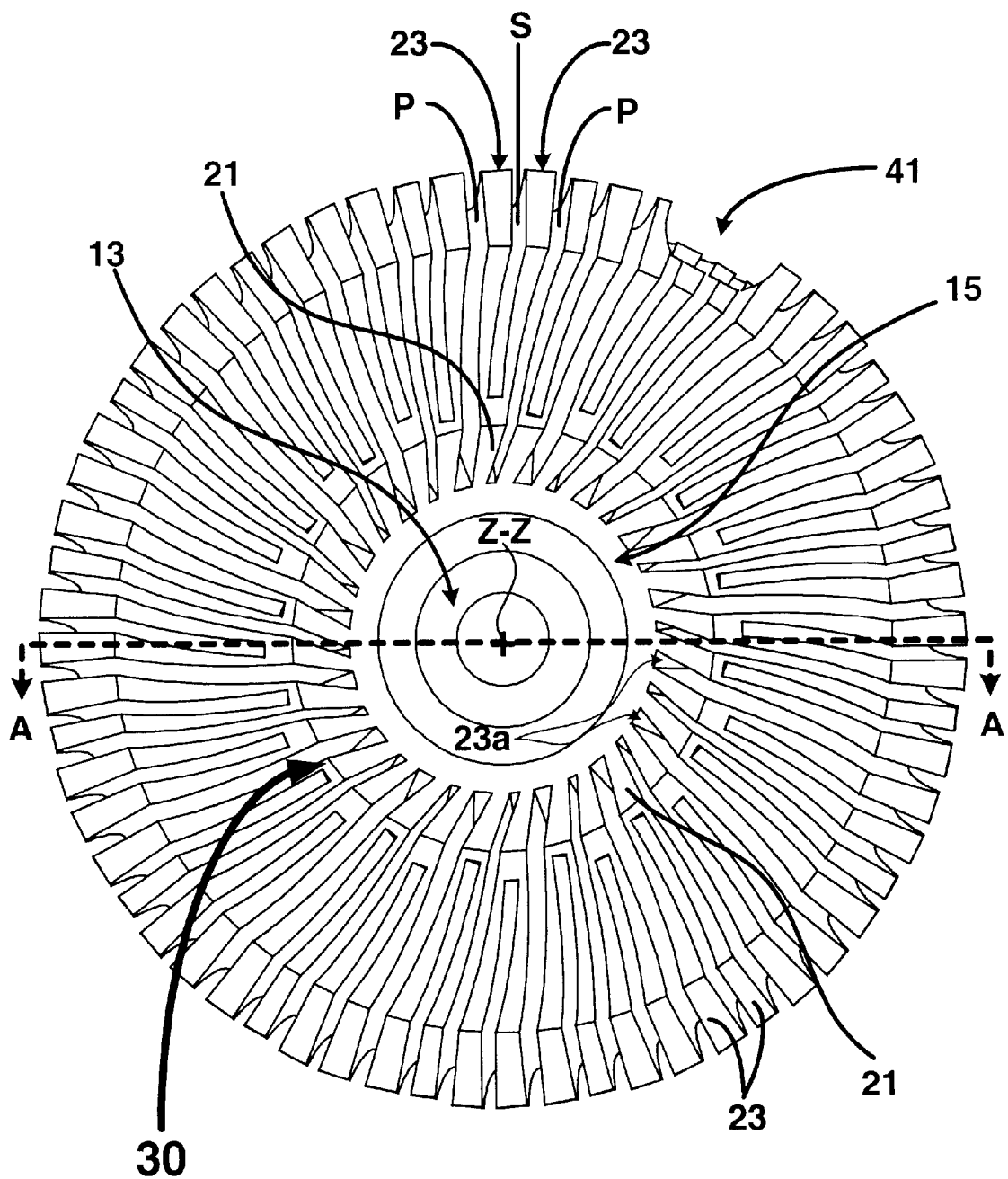
FIGS. 2a and 2b are top plan views of a cooling device according to the present invention.

In the following detailed description and in the several figures of the drawings, like elements are identified with like reference numerals.

As shown in the drawings for purpose of illustration, the present invention is embodied in a cooling device for dissipating heat from a component that is in thermal communication with the cooling device. The thermal communication can be by direct contact between the cooling device and the component or by an intermediate material positioned between the cooling device and the component as will be described below. The component can be any heat source such as an electrical component, for example. The cooling device includes a heat mass with a boss surrounded by a groove and with the groove and the boss symmetrically positioned about an axis of the heat mass. The boss has a convex arcuate surface profile and the groove has a concave arcuate surface profile. A heat conductive base is in contact with the heat mass and includes a mounting surface adapted to contact the component to be cooled.

A plurality of vanes surround the heat mass and the vane are spaced apart from one another to define a primary slot between adjacent vanes. The primary slot extends to the heat mass so that an exhaust flow of air cools the vanes and the heat mass. The vanes have a surface area that increases in a radially outward direction from the axis and in a direction along the axis. A plurality of fins are formed in each vane by a secondary slot extending through a portion of each vane.

The vanes include a top face and an aerodynamically profiled inner wall that includes a first portion extending from the groove and terminating at a second portion that extends to the top face. The inner wall defines a chamber that surrounds the groove. The vanes also include an outer wall having a surface profile that widens from the base to the top face. The surface profile includes a smooth curved portion, a draft portion, and a smooth radially outward portion.

An air flow entering the chamber creates a three-dimensional air flow that dissipates heat from the cooling device. First, the air flow exits the primary slots and a bottom portion of the secondary slots in an exhaust flow that dissipates heat from the vanes and the fins. Second, the exhaust flow creates a low pressure region within the chamber that induces an intake flow into the chamber through a major portion of the secondary slots and a top portion of the primary slots thereby dissipating heat from the fins and the vanes. Third, the low pressure region induces a surface flow along the first and second portions of the inner wall so that the surface flow wets the groove and the boss as it passes over the groove and the boss to dissipate heat from the heat mass.

In FIGS. 1 and 2a through 2c, a cooling device 10 for dissipating heat from a component (not shown) includes a heat mass 11, a boss 13, and a groove 15 that completely surrounds the boss 13. The boss 13 and the groove 15 are symmetrically positioned about an axis Z—Z of the heat mass 11. The boss 13 has a convex arcuate surface profile and the groove 15 has a concave arcuate surface profile. The arcuate profiles of the boss and the groove (13, 15) blend into each other as illustrated by dashed line a. The cooling device 10 further includes a heat conductive base 17 (base 17 hereinafter) that is in contact with the heat mass 11 and the base 17 includes a mounting surface 19 for contacting a surface of the component to be cooled. A plurality of vanes 21 are in contact with the heat mass 11 and the vanes 21 are spaced apart from one another to define a primary slot P (see FIGS. 2a and 2c) between adjacent vanes 21. The vanes 21 have a surface area that increases in a radially outward direction from the axis Z—Z as indicated by the dashed arrow. At least a portion of the vanes 21 have a surface area that increases in a direction along the axis Z—Z as shown by dashed arrow y.

Preferably, the primary slot P extends to the heat mass 11 and the primary slot P includes a first arcuate surface profile 21a along the heat mass 11. The first arcuate profile 21a terminates on a plane H—H (see FIG. 1). The plane H—H can be coincident with a bottom surface 11a of the heat mass 11. It is also preferable that the vanes 21 are equidistantly spaced apart from each another. By extending the primary slot P to the heat mass 11, air flow through the vanes 21 also wets the heat mass 11 to dissipate heat therefrom. The first arcuate surface profile 21a can be an arc having a radius from about 38.0 millimeters to about 45.0 millimeters.

One advantage of the cooling device 10, is that a fan (not shown) for generating an air flow is not mounted on the heat mass 11. Consequently, the vanes 21 can extend deep into the heat mass 11 (as illustrated by arrow e) and the depth of the vanes 21 provides a large surface area for efficient dissipation of waste heat and exposes the heat mass 11 to an air flow (see FIGS. 3a and 3b) that wets over the boss 13 and the groove 15 so that additional waste heat can be dissipated from the heat mass 11.

The vanes 21 also include a top face 29, an aerodynamically profiled inner wall 26 including a first portion 25 that extends from the groove 15 and terminates at a second portion 27 that extends to the top face 29. The first portion 25 blends with the arcuate profile of the groove 15 as illustrated by dashed line b and the first portion 25 blends with the second portion 27 as illustrated by dashed line C. The second portion 27 blends with the top face 29 as illustrated by dashed line d. The inner wall 26 can include additional portions and the present invention is not to be construed as being limited to the first and second portions (25, 27). The inner wall 26 defines a chamber 30 that surrounds the groove 15.

Figure 2C:
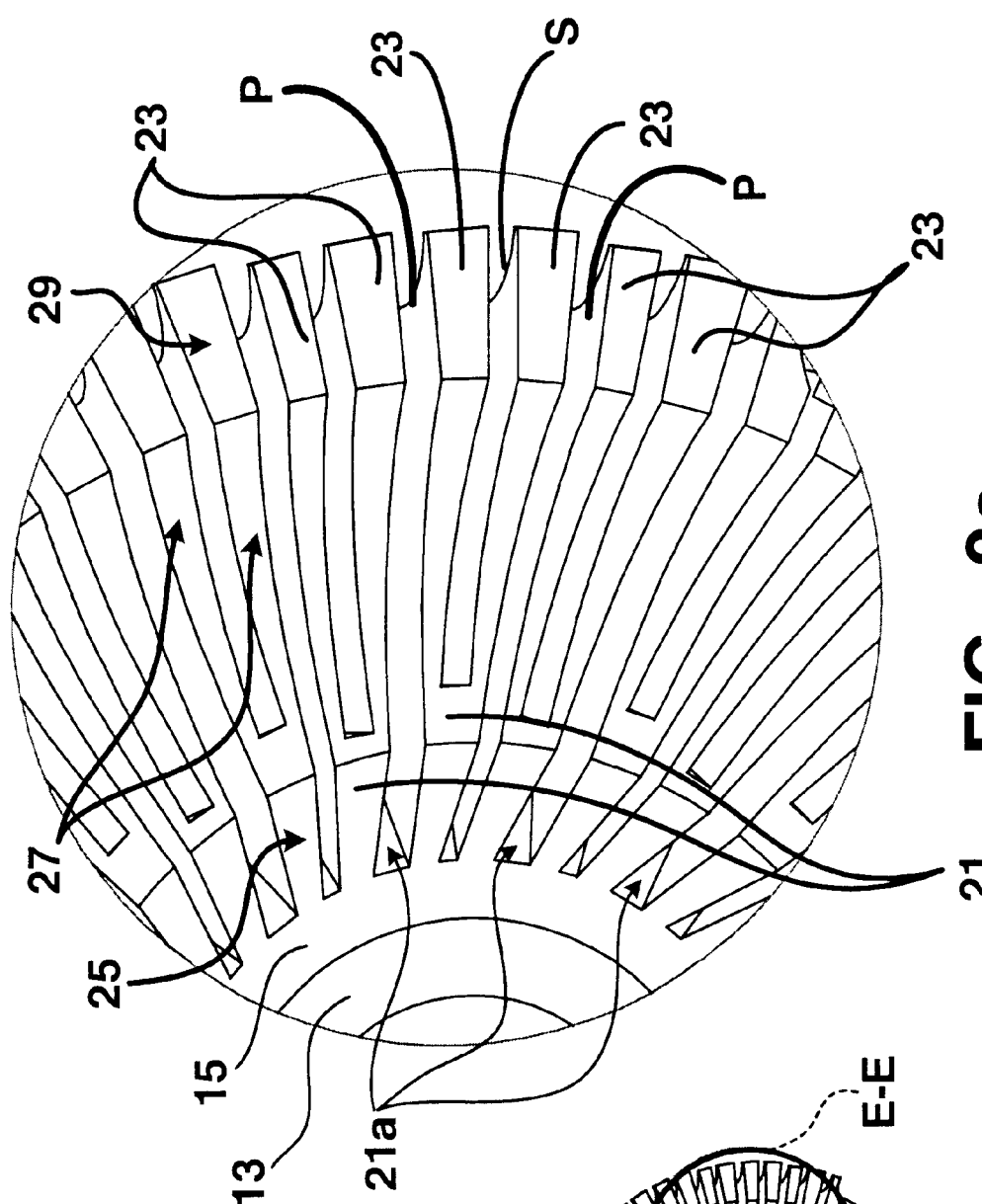
FIGS. 2c is detailed view of a portion of the top plan view of FIG. 2b.
Figure 3A:
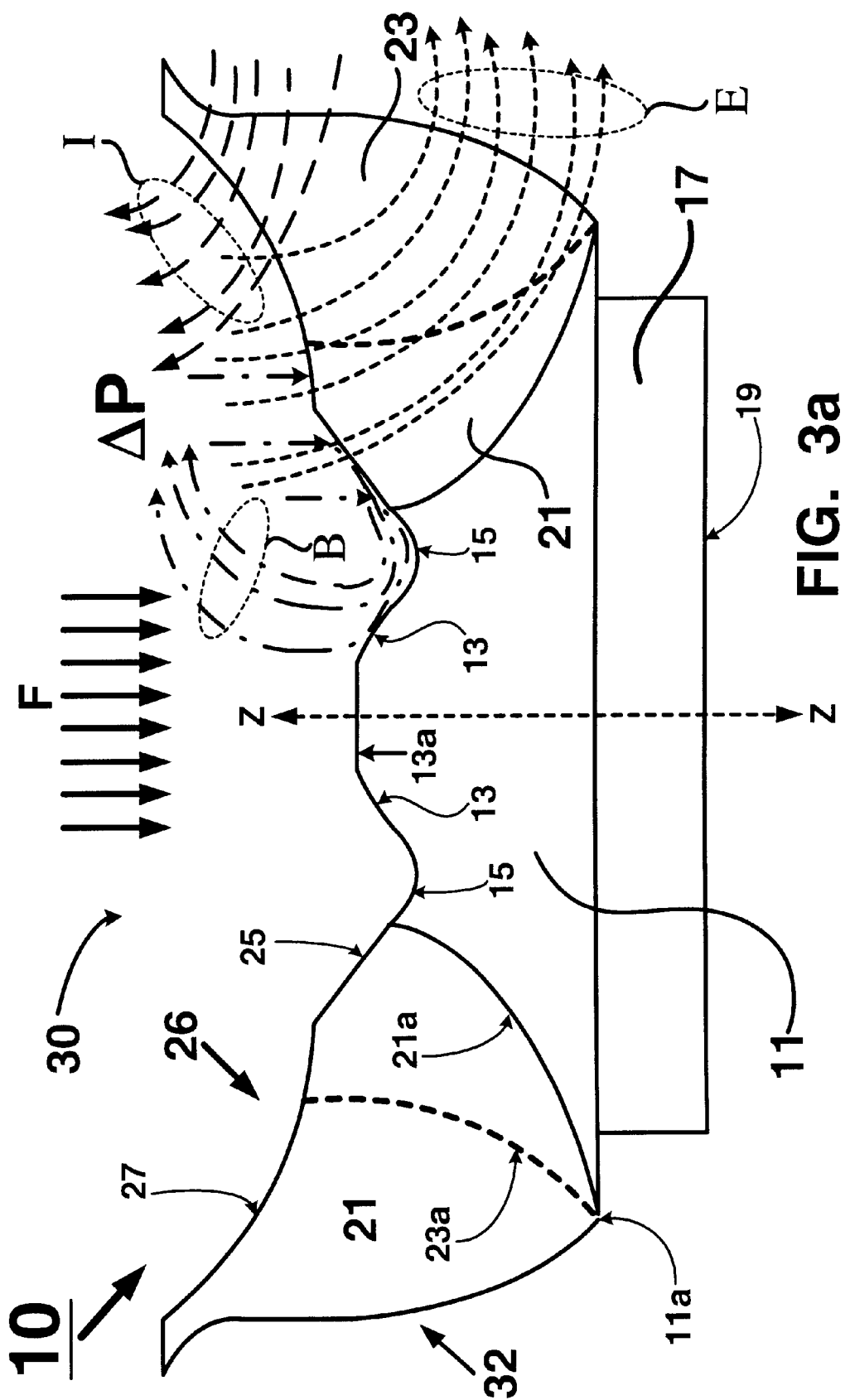
FIG. 3a is a cross-sectional view along line A—A of FIG. 3b of air flow into and out of a cooling device according to the present invention.
Figure 3B:
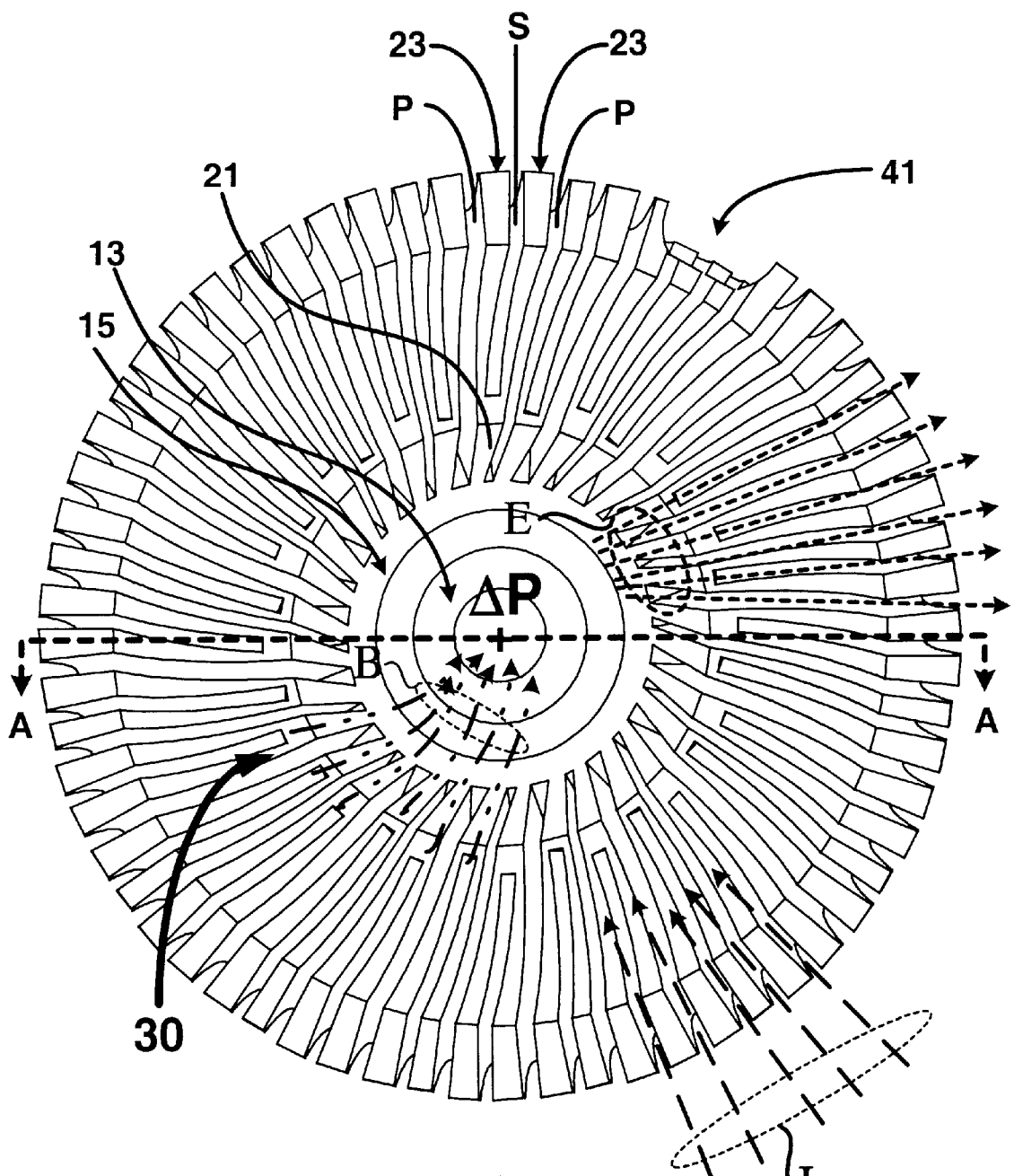
FIG. 3b is a top plan view of air flow into and out of a cooling device according to the present invention.
Figure 4:
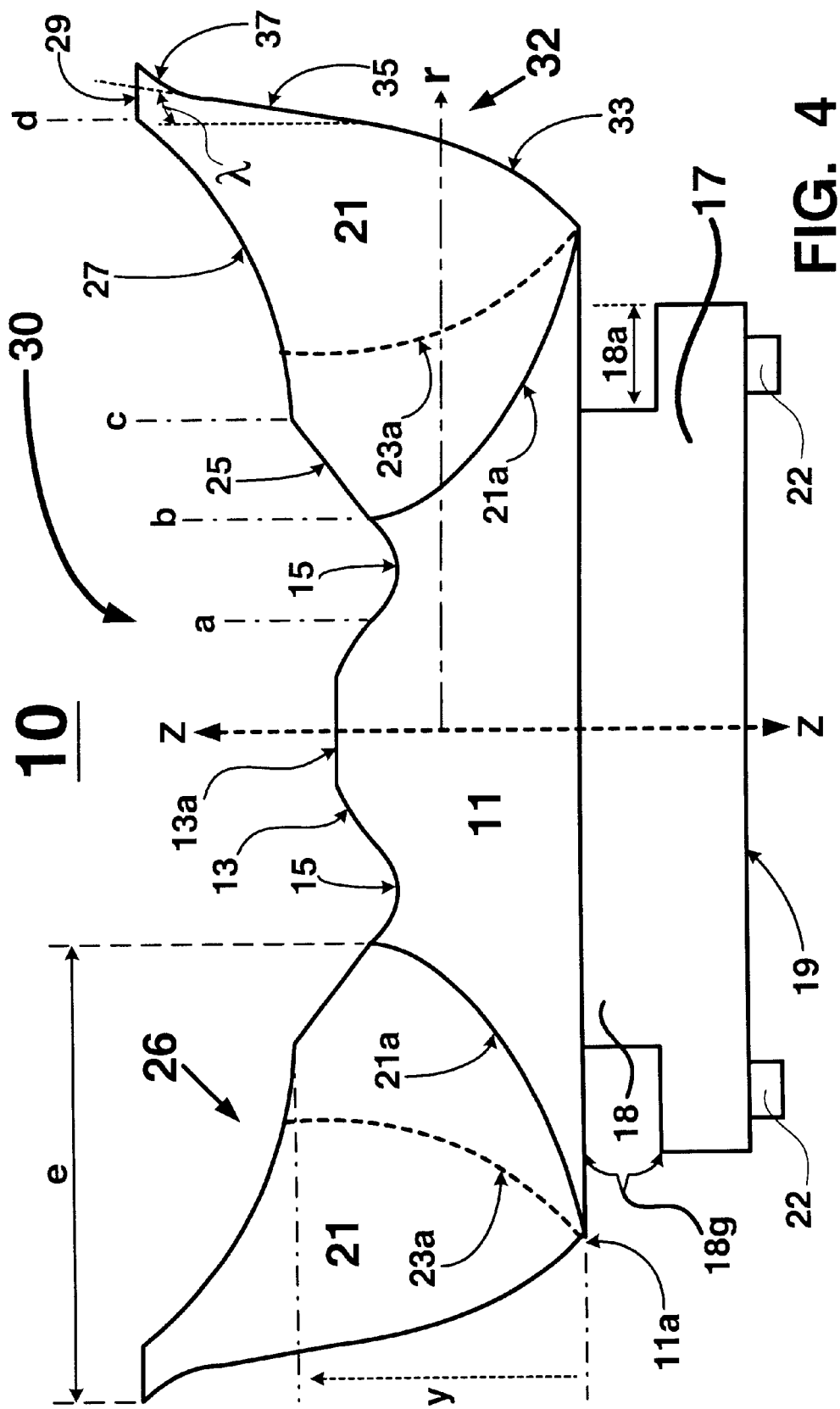
FIG. 4 is a cross-sectional view of a cooling device with a base with an inset neck portion according to the present invention.

In one embodiment of the present invention, as illustrated in FIGS. 1, 2c, and 4, the first portion 25 of the inner wall 26 is a slope surface and the second portion 27 of the inner wall 26 is a concave arcuate surface. The sloped and concave arcuate surfaces aerodynamically interact with an air flow into the chamber 30 so that the air flows along the first and second portions (25, 27) of the inner wall 26 and wet over the groove and the boss (15, 13) to dissipate heat from the heat mass 11 as will be described below in reference to FIGS. 3a and 3b.

The first portion 25 can be inclined at an angle Ψ with respect to the axis Z—Z as illustrated in FIG. 1. The angle Ψ can be in a range from about 15.0 degrees to about 75.0 degrees. If the vanes 21 have a tangential orientation with a circle about the axis Z—Z as will be discussed below in reference to FIG. 6, then the first portion 25 will have a tangential orientation with the groove 15. The angle Ψ will vary based primarily on an output of a fan (not shown) in cubic feet per minute (CFM).

The vanes 21 further include an outer wall 32 having a surface profile that widens from a bottom 11a of the heat mass 11 to the top face 29 and includes a smooth curved portion 33, a draft portion 35, and a smooth radially outward portion 37. The draft portion 35 an be substantially parallel to the axis Z—Z or the draft portion 35 can be inclined at an angle λ as illustrated in FIG. 4.

Figure 2B:
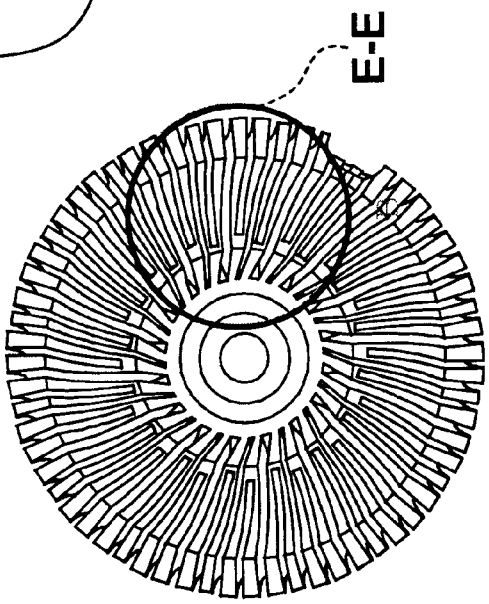

In FIGS. 2a through 2c, the vanes 21 include at least one secondary slot S that extends through a portion of each vane 21 to define a plurality of fins 23 (two are shown) in each vane 21. By splitting at least a portion of each vane 21 into a plurality of fins 23, the available surface area for dissipating waste heat is increased and the secondary slot S provides an additional air flow path between the fins 23 that further increases waste heat dissipation.

In another embodiment of the present invention, the secondary slot S extends to the heat mass 11 and the secondary slot S includes a second arcuate profile 23a (see dashed line in FIG. 1) along the heat mass 11. The second arcuate profile 23a terminates on the plane H—H. By extending the secondary slot S to the heat mass 11, air flow through the fins 23 also wets the heat mass 11 to dissipate heat therefrom. The second arcuate profile 23a can be an arc having a radius from about 31.0 millimeters to about 38.0 millimeters.

Reference points for a center of the above mentioned radiuses (i.e. for 21a and 23a) will be positioned outside the cooling device 10 and the actual location of the center will depend on the arcs radius. However, the position of the center of the radius will be at least about 5.0 millimeters outside of the cooling device 10 to accommodate a cutting tool used in a machining process for making the cooling device 10. The position of the center of the radius is a limitation imposed by a machining process that uses cutting wheels to form the vanes 21 and the fins 23. If the vanes 21 and the fins 23 can be diecasted or impact forged, then the arc radius could be reduced and the position of the center of the radius could come inside the cooling device 10. The cooling device 10 can be made amendable to a diecasted or impact forged process by reducing the number of vanes 21.

In FIGS. 3a and 3b, heat dissipation by an air flow F entering the chamber 30 is illustrated. A portion of the air flow F exits the chamber 30 through the primary slots P and a bottom portion of the secondary slots S (not shown) in an exhaust flow E. The exhaust flow E passes over the vanes 21 and the fins 23 and dissipates heat therefrom. A low pressure region $\Delta P$ is created within the chamber 30 by the exhaust flow E. Consequently, the low pressure region $\Delta P$ induces an intake flow I into the chamber 30 through a major portion of the secondary slots S and a top portion of the primary slots P (not shown) thereby dissipating heat from the fins 23 and the vanes 21. The low pressure region $\Delta P$ also induces a surface flow B along the aerodynamically shaped first and second portions (25, 27) of the inner wall 26. The surface flow B passes over the arcuate profiles of the groove and boss (15, 13) thereby dissipating heat from the heat mass 11 as the surface flow B circulates back towards (i.e. it is a balancing air flow) the low pressure region $\Delta P$. Therefore, another advantage of the cooling device 10 is that waste heat is efficiently dissipated by a three-dimensional air flow (comprising E, I, and B) through the vanes 21 and the fins 23, and passing over the groove and boss (15, 13).

In one embodiment of the present invention, the arcuate surface profile of the boss 13 includes but is not limited to a profile of a sphere, a frustum of a sphere, a cone, and a frustum of a cone. In FIG. 1, the boss 13 has a conical surface profile. On the other hand, the surface profile could also be spherical. In FIG. 4, the boss 13 has a surface profile that is a frustum 13a of a cone. The boss 13 could also have a surface profile that is a frustum 13a of a sphere.

In another embodiment of the present invention, the arcuate surface profile of the groove 15 includes but is not limited to a semi-circular profile as illustrated in FIGS. 1 and 4. Preferably, the boss 13 has a diameter $d_B$ (see FIG. 1) that is less than a diameter of a hub 79 of a fan 70 (see FIG. 9). The groove 15 should have a radius $r_G$ (see FIG. 9) that provides a smooth change in air flow direction for the surface flow B as it transitions from the first portion 25 to the groove 15 so that the surface flow B flows over the groove 15 and onto the boss 13 (see FIG. 3a). As mentioned previously, the boss 13, the groove 15, and the inner wall 26 (i.e. 25 and 27) can be formed by forging, machining, or diecasting.

Figure 5A:
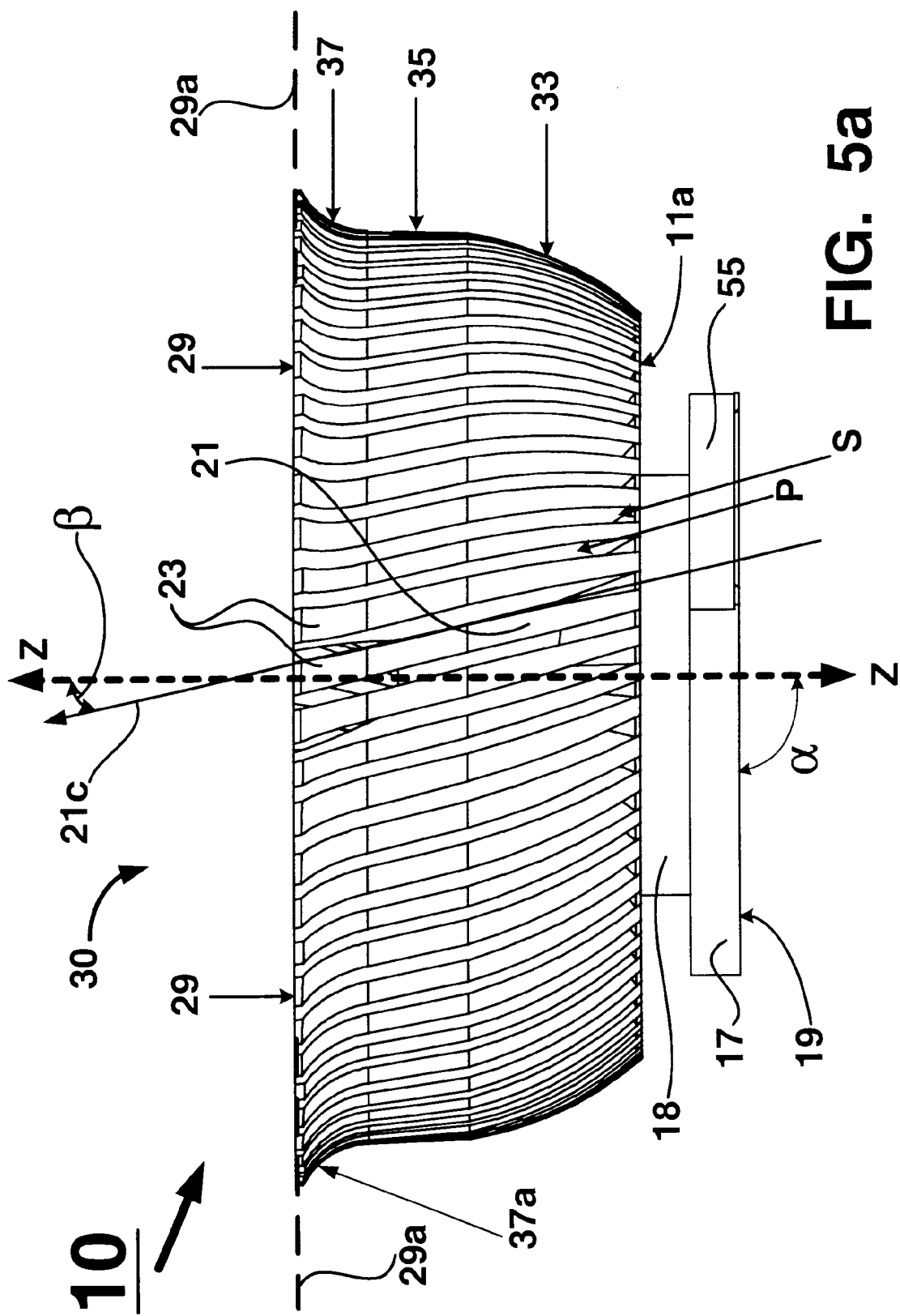
FIGS. 5a and 5b are side views of a cooling device with vanes inclined at an angle according to the present invention.
Figure 5B:
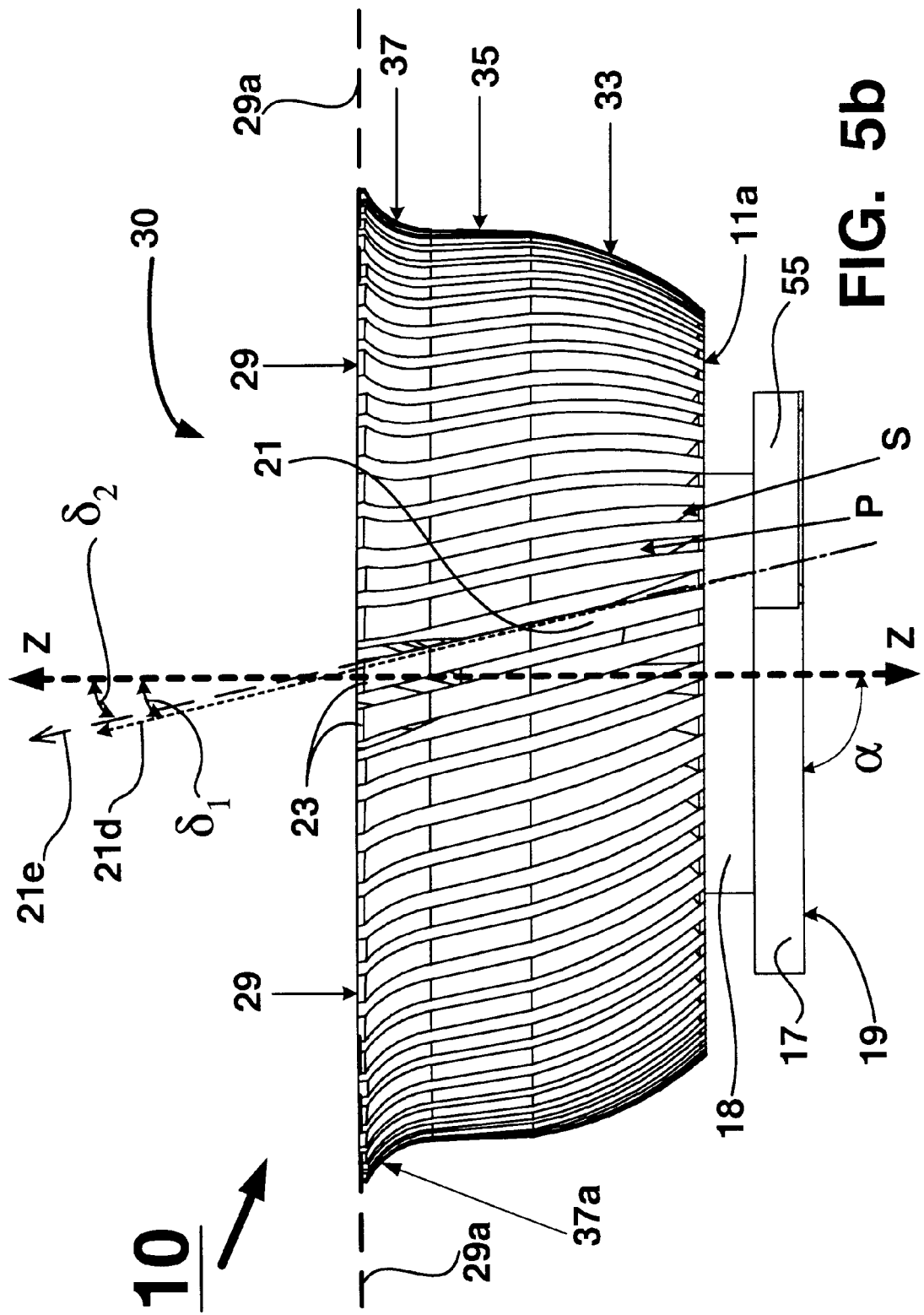

In FIGS. 5a and 5b, the vanes 21 can be inclined at angle with respect to the axis Z—Z. In FIG. 5a, the vanes 21 are inclined at an angle $\beta$ measured between a line 21c and the axis Z—Z. The line 21c is measured along the primary slot P of the fins 23. The inclination of the angle $\beta$ includes but is not limited to a range from about 0 (zero) degrees to about 25.0 degrees. In another embodiment of the present invention as illustrated in FIG. 5b, the angle at which the vanes 21 are inclined with respect to the axis Z—Z includes a first angle $\delta_1$ measured between a line 21d and the axis Z—Z and a second angle 62 measured between a line 21e and the axis Z—Z. The first angle $\delta_1$ is measured along the smooth radially outward portion 37 of the fins 23. The inclination of the first angle $\delta_1$ includes but is not limited to a range from about 0 (zero) degrees to about 25.0 degrees. The second angle $\delta_2$ is measured along the the smooth curved portion 33 of the fins 23. The inclination of the second angle $\delta_2$ includes but is not limited to a range from about 5.0 degrees to about 18.0 degrees. Because the fins 23 are defined by the vanes 21, the fins 23 and the vanes 21 are inclined at the angles ($\beta$, $\delta_1$, and $\delta_2$) as described above.

Figure 6:
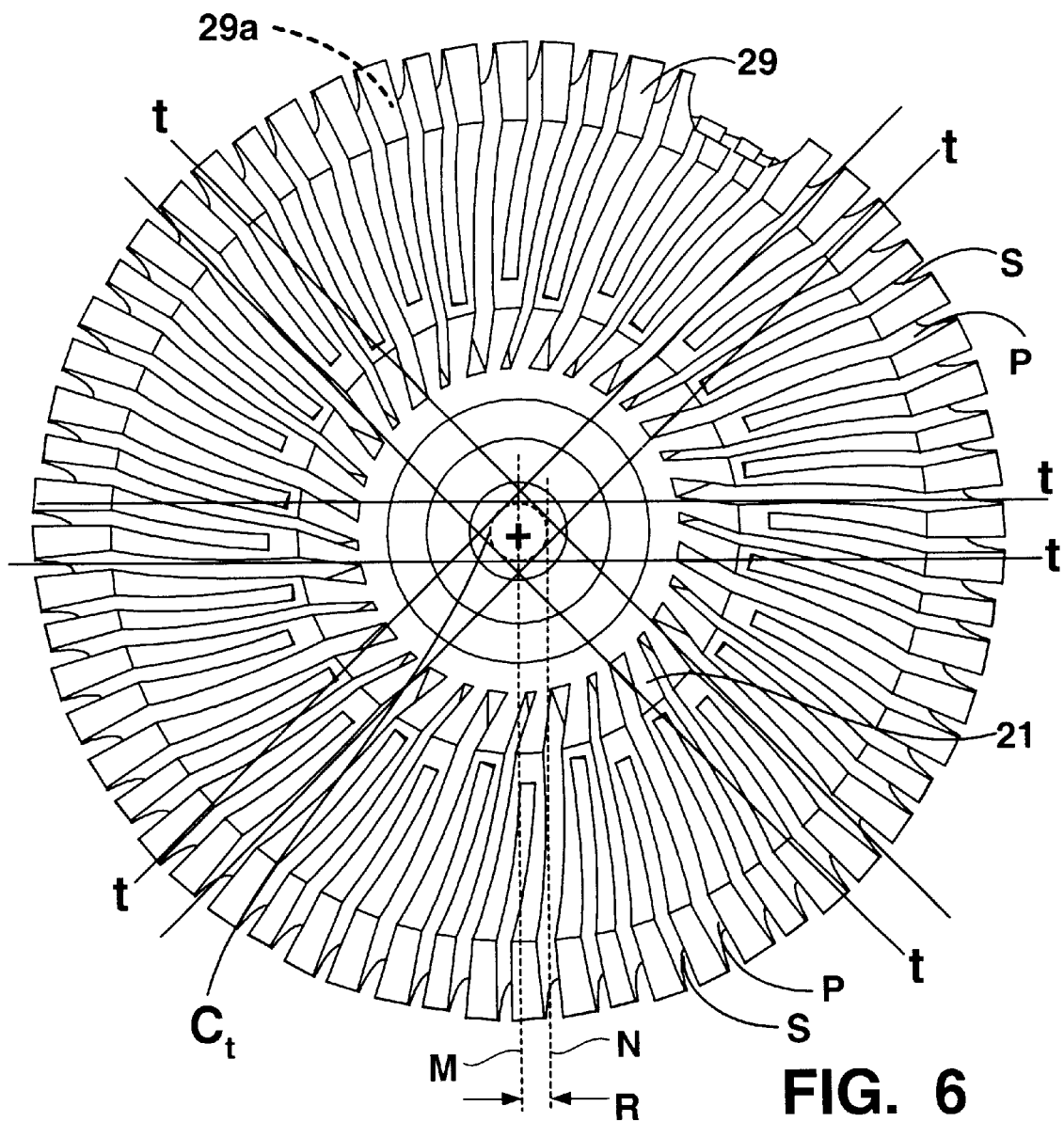
FIG. 6 is a top plan view illustrating a cooling device having vanes with a tangential orientation according to the present invention.

In one embodiment of the present invention as illustrated in FIG. 6, the vanes 21 have a tangential orientation with respect to a circle $C_t$ (shown in dashed line) centered about the axis Z—Z (shown as a "+") and having a predetermined diameter. In FIG. 6, an example of the. tangential orientation of the vanes 21 is illustrated by a plurality of the vanes 21 having tangent lines t drawn through their primary slots P and tangentially crossing a perimeter of the circle $C_t$. A line M through the axis Z—Z and a parallel line N that also is tangential to the circle $C_t$ define a radius R therebetween and the predetermined diameter of the circle $C_t$ is two times the radius R (that is: $C_t = 2*R$). The predetermined diameter includes but is not limited to a range from about 3.0 millimeters to about 12.0 millimeters.

In FIGS. 5a, 5b, and 6, at least a portion of the top face 29 of the vanes 21 includes a substantially planar portion 29a (shown as a dashed line). Preferably the substantially planar portion 29a covers the entirety of the top face 29 as illustrated in FIG. 6. One advantage of the substantially planar portion 29a of the top face 29 is that a fan can be mounted on the substantially planar portion 29a.

Figure 7:
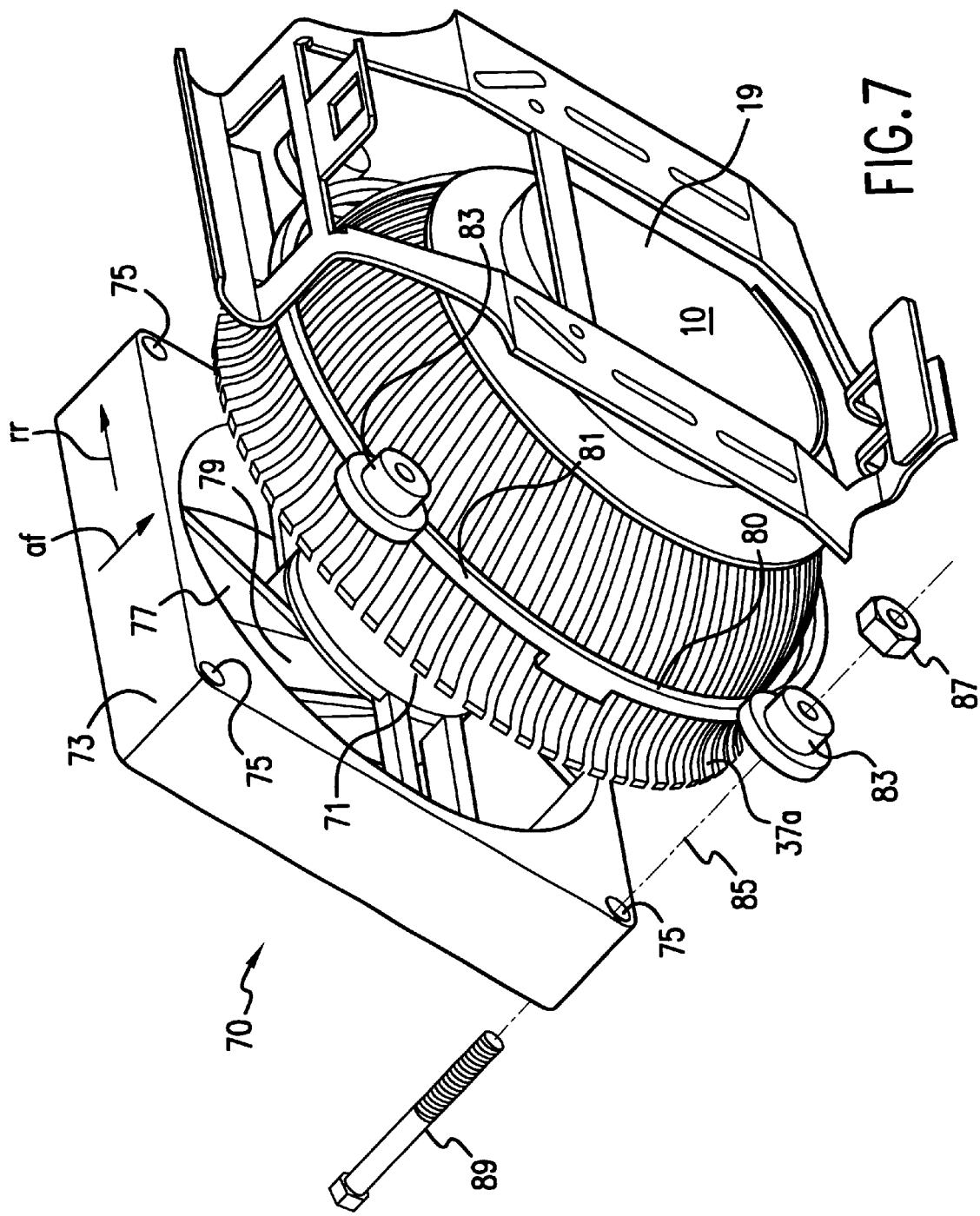
FIG. 7 is a profile view of a mounting ring for connecting a fan with a cooling device according to the present invention.

In FIG. 7, a fan 70 is positioned to be mounted on the substantially planar portion 29a of the top face 29. The fan 70 generates an air flow (see reference letter F in FIG. 3a) into the chamber 30 of the cooling device 10 in a direction indicated by dashed arrow af. A shroud 73 houses a rotor hub 79 having a plurality of fan blades 77. The rotor hub 79 is rotatably mounted on a stator 71 and the fan blades 77 rotate in a direction indicated by arrow af. Several holes 75 through the shroud 77 are adapted to receive a fastener 89.

Figure 8:
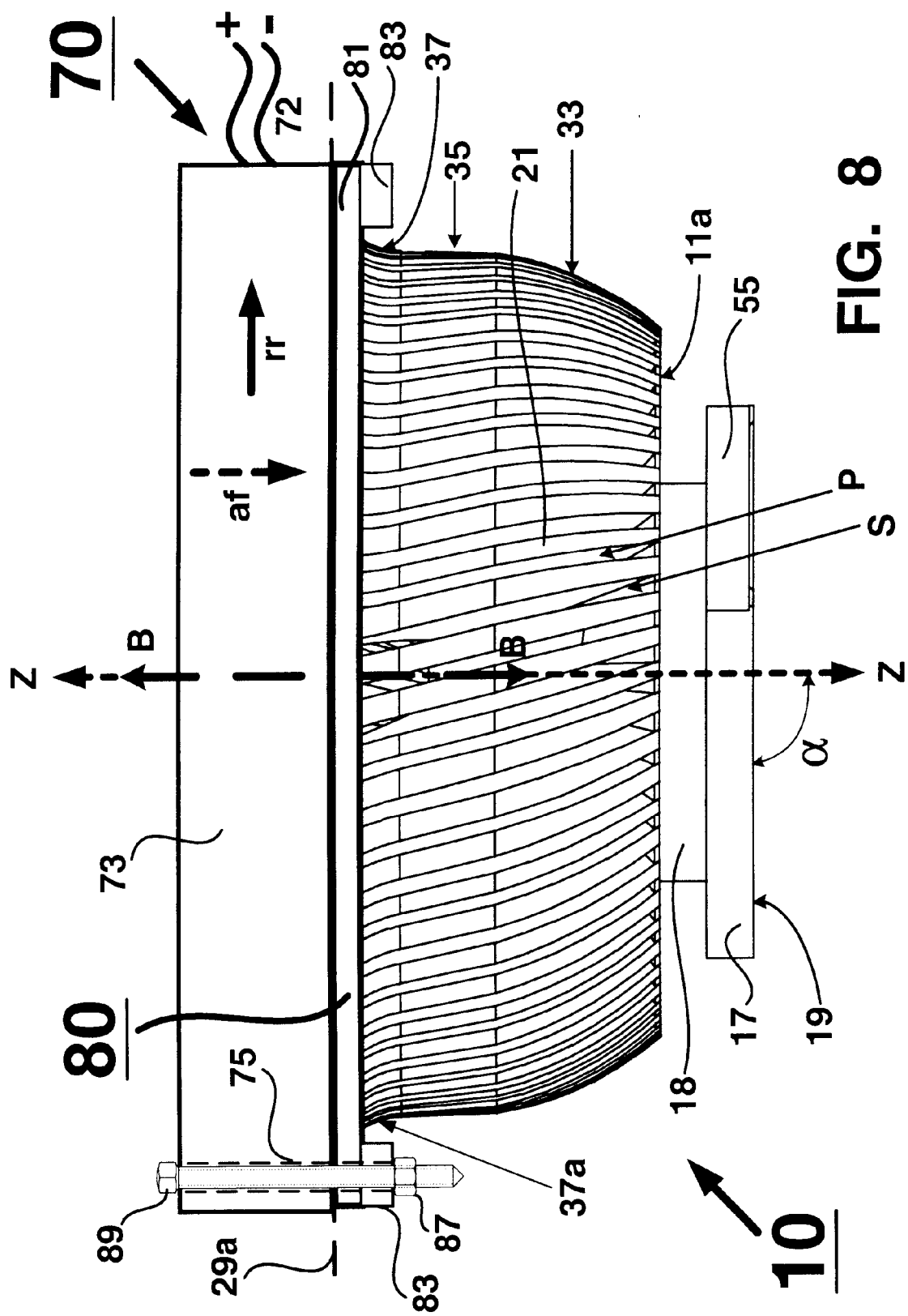
FIG. 8 is a side view of a fan mounted to a cooling device according to the present invention.

A mounting ring 80 including a frame 81 and several mounting fixtures 83 is abutted against a surface 37a of the smooth radially outward portion 37. The diameter of the smooth radially outward portion 37 at the surface 37a is greater than an inside diameter of the frame 81 of the mounting ring 80 so that the frame 81 can be urged into snug contact with the smooth radially outward portion 37 without sliding off of the vanes and fins (21, 23). The only way to slide the mounting ring 80 off of the vanes and fins (21, 23) is in the direction of the base 17 because the diameter of the vanes and fins (21, 23) narrows in that direction. The mounting fixtures 83 receive the fastener 89 and optionally an additional fastener 87 such that the fan 70 is firmly connected with the top face 29 as illustrated in FIG. 8. The fasteners (87, 89) can be a nut and bolt as shown or another type of fastener. Preferably, a rotational axis B—B of the fan 70 is colinear with the axis Z—Z of the cooling device 10 when the fan 70 is connected with the mounting ring 80. Examples of suitable materials for the mounting ring 80 include but are not limited to metals, plastics, or ceramics. The mounting ring 80 can be produced by machining, casting, molding, and pressure diecasting.

Although the previous discussion has focused on fasteners as one means of connecting the mounting ring 80 with the fan 70, the present invention is not to be construed as being limited to fasteners only. For instance, a latch on the fan could mate with a complementary latching profile on the mounting ring 80. Because the mounting ring 80 can be formed by an injection molding process, many possibilities exist for effectuating the mounting of the fan 70 to the mounting ring 80 and fasteners are an example of one of those many possibilities.

In FIG. 8, the fan 70 is shown mounted on the substantially planar portion 29a of the top face 29. For purposes of illustration, only one set of fasteners (87, 89) are shown installed through the holes 75 and the mounting fixtures 83. A power lead 72 of the fan 70 is positioned so that it is not necessary for the power lead 72 to be routed through or to come into contact with the vanes or fins (21, 23). Although shown with only two wires (+ and −) the power lead 72 can include additional wires such as one or more additional wires for communicating with a circuit that controls the fan 70 (e.g turning fan 70 on or off, or controlling fan speed) or for determining if the fan 70 is operating properly.

Although only one fan 70 is shown in FIGS. 7 and 8, two or more fans 70 can be stacked one upon the other with the holes 75 aligned so that a longer fastener 89 can be inserted through the holes 75 an into the mounting fixtures 83 of th e mounting ring 80. Therefore, another advantage of the cooling device 10 of the present invention is that a plurality of fans can be used to generate the air flow F into the chamber 30. The use of more than one fan 70 allows for redundant cooling if one or more fans should fail. In contrast, prior fan assisted heat sinks in which the fan is mounted in a cavity formed by the fins, it is very difficult to mount more than one fan in the cavity. Moreover, because the fan 70 is not mounted in the chamber 30, the risk s associated w ith routing the power lead 72 through th e vanes 21 is eliminated because the fan 70 is mounted on the top face 29. An additional advantage to mounting the fan 70 on the top face is that if one or more of the vanes and fins (21, 23) are damaged, the blades 77 will not come into contact with a damaged vane or fin (21, 23); therefore, potential damage to the blades 77 or the fan 70 is eliminated. In FIG. 3b, a notch 41 can be formed in the fins 23. The notch 41 can have a shape the complements an indexing tab (not shown) on the shroud 73 so that when the fan 70 is mounted on the top face 29 the indexing tab mates with the notch 41. The notch 41 can be used to ensure proper orientation of the fan 70 with respect to the cooling device 10 and/or to prevent relative movement between the shroud 73 and the cooling device 10.

Figure 9:
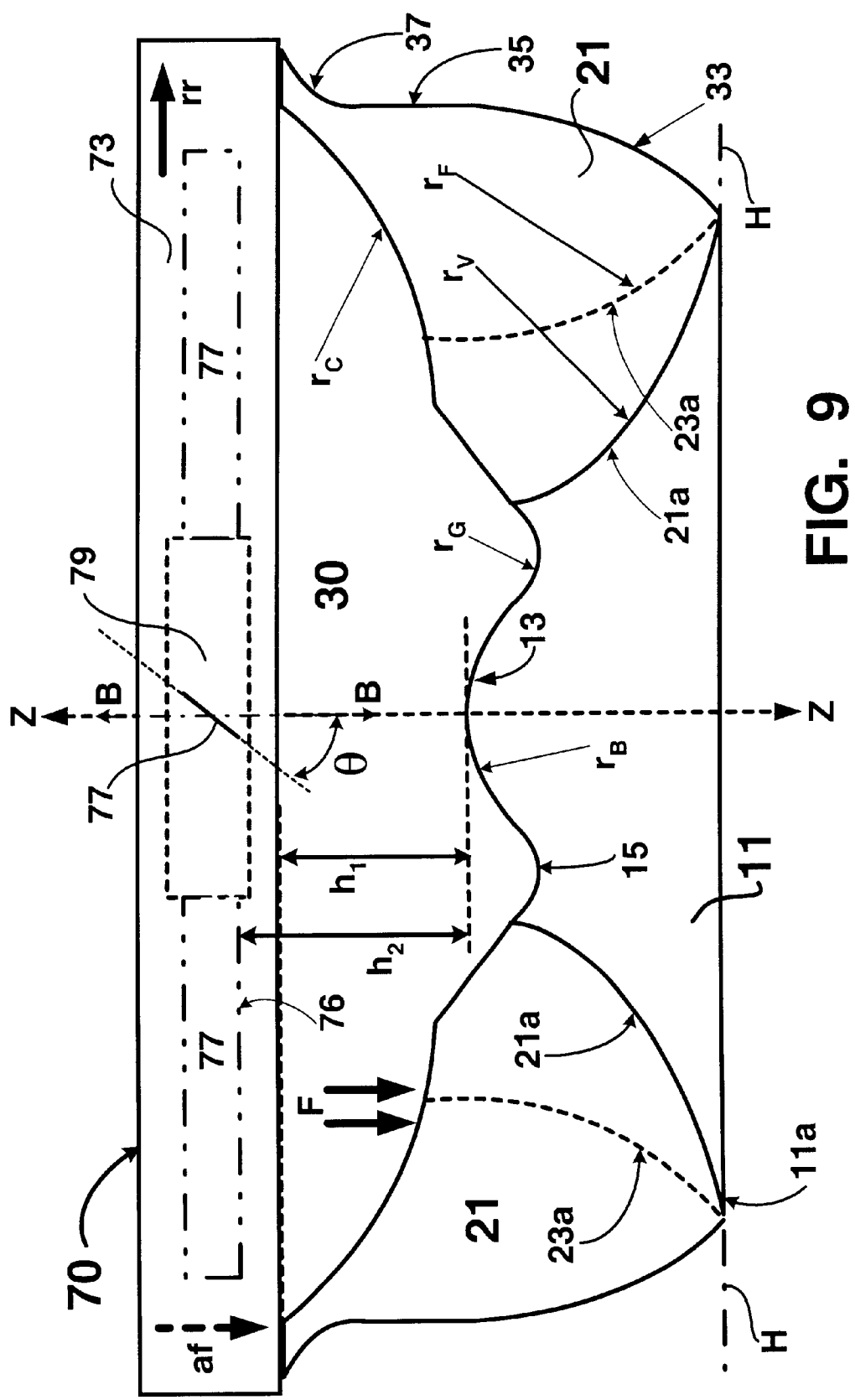
FIG. 9 is a cross-sectional view illustrating various dimensional relationships between a fan and a cooling device according to the present invention.

In FIG. 9, the tangential orientation of the vanes 21 can be determined by two factors (note: the base 17 has been omitted for purposes of illustration) A first factor is a height $h_1$ from the top of the boss 13 to the top face 29. For example, when the height $h_2$ is about 7.5 millimeters, the vanes 21 can be tangential to the circle $C_t$ having a diameter of about 6.5 millimeters. On the other hand, a second factor is a height $h_2$ from the top of the boss 13 to a bottom 76 of the fan blades 77. For instance, the diameter of the circle $C_t$ can be from about 3.0 millimeters to about 12.0 millimeters when the height $h_2$ varies from about 2.0 millimeters to about 8.5 millimeters. The above are examples only and the heights ($h_1$, $h_2$) are not to be construed as being limited to the ranges set forth above.

The angle ($\beta$, $\delta_1$, and $\delta_2$) at which the vanes 21 are inclined relative to the axis Z—Z as described above can be set to substantially match or closely approximate a pitch angle $\theta$ of the fan blades 77 as illustrated in FIG. 9. On the other hand, the angles ($\beta$, $\delta_1$, and $\delta_2$) can be set so that they are within a predetermined range of the pitch angle $\theta$. For example, the pitch angle $\theta$ can be about 15.0 degrees and the angle $\beta$ can be about 17.0 degrees or the pitch angle $\theta$ can be about 12.0 degrees and the angle $\delta_1$ can be about 10.0 degrees and the angle $\delta_2$ can be about 8.0 degrees.

Another advantage of the cooling device 10 of the present invention is that the aforementioned tangential orientation and inclination of the vanes 21 and the aerodynamically profiled first and second portions (25, 27) of the inner wall 26 provide a low resistance path to the air flow F thereby reducing airflow shock noise. Additionally, because of the low resistance path, the fan 70 can be a lower RPM fan which produces lower noise levels and can be operated on less power than a higher RPM fan.

The cross-sectional view of the cooling device 10 in FIG. 9 (sans the base 17) also depicts radiuses for the arcuate shapes of the boss 13, the groove 15, the second portion 27, the first arcuate surface profile 21a, and the second arcuate surface profile 23a.

The arcuate profile of the boss 13 can have a radius $r_B$ that is dependent in part on a desired thermal mass for the boss 13. For instance, for a thermal mass of about 50.0 grams, the radius $r_B$ for the boss 13 is about 15.0 millimeters. Similarly, the arcuate profile of the groove 15 has a radius $r_G$ of about 2.5 millimeters. The actual values for $r_B$ and $r_G$ will be application dependent and the above values are examples only. The present invention is not to be construed as being limited to the values set forth above.

Furthermore, the arcuate surface profiles for the first and second arcuate surface profiles (21a, 23a) have a radius of $r_V$ and $r_F$ respectively. For example, the radius $r_V$ can be from about 38.0 millimeters to about 45.0 millimeters and the radius $r_F$ can be from about 31.0 millimeters to about 38.0 millimeters. The second portion 27 of the inner wall 26 has a radius $r_C$. The radius $r_C$ can be about 20.0 millimeters, for example. The actual values for $r_V$, $r_F$ and $r_G$ will be application dependent and the above values are examples only. The present invention is not to be construed as being limited to the values set forth above.

The above mentioned radiuses can be determined by a machining process used to form the cooling device 10. Reference points for the radiuses need not be relative to a point on the cooling device 10. The radiuses $r_B$, $r_G$ and $r_C$ can be formed by a forging process. They can also be machined or produced using a diecasting process. The radiuses $r_V$ and $r_F$ can be formed by machining after forging the cooling device 10 from a blank or material.

Figure 10:
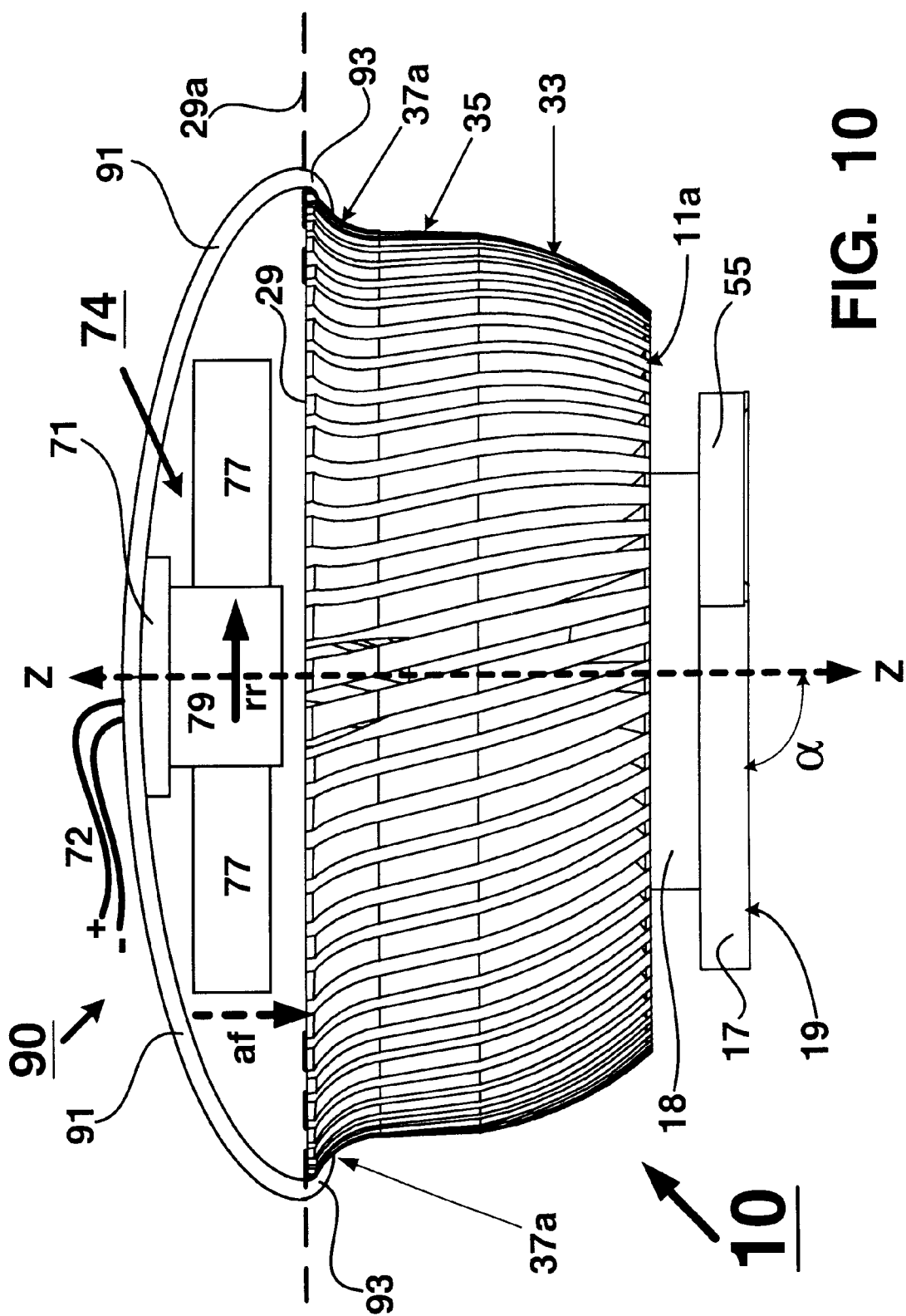
FIG. 10 is a side view of a space frame mounting a fan to a cooling device according to the present invention.

In one embodiment of the present invention as illustrated in FIG. 10, a fan 74 without a shroud (i.e. it lacks the shroud 73 of FIGS. 7 and 8) is positioned over the top face 29 of the cooling device 10 by a space frame 90. A stator 71 of the fan 74 is connected with the space frame 90 and a plurality of arms 91 span the width of the top face 29 and fingers 93 at the ends of the arms 91 clamp the space frame 90 to the cooling device 10 approximately at the surface 37a of the smooth radially outward portion 37. Consequently, a hub 79 and blades 77 of the fan 74 are positioned over the chamber 30 so that an air flow from the fan 74 can enter the chamber 30 as was described above. Moreover, power leads 72 from the fan 74 can be routed away from the fins and vanes (21, 23) of the cooling device 10 and away from the fan blades 77.

The space frame 90 can be integrally formed with the stator 71 or the space frame 90 can be made from a metal or plastic material, preferably plastic because it is electrically non-conductive.

Figure 11:
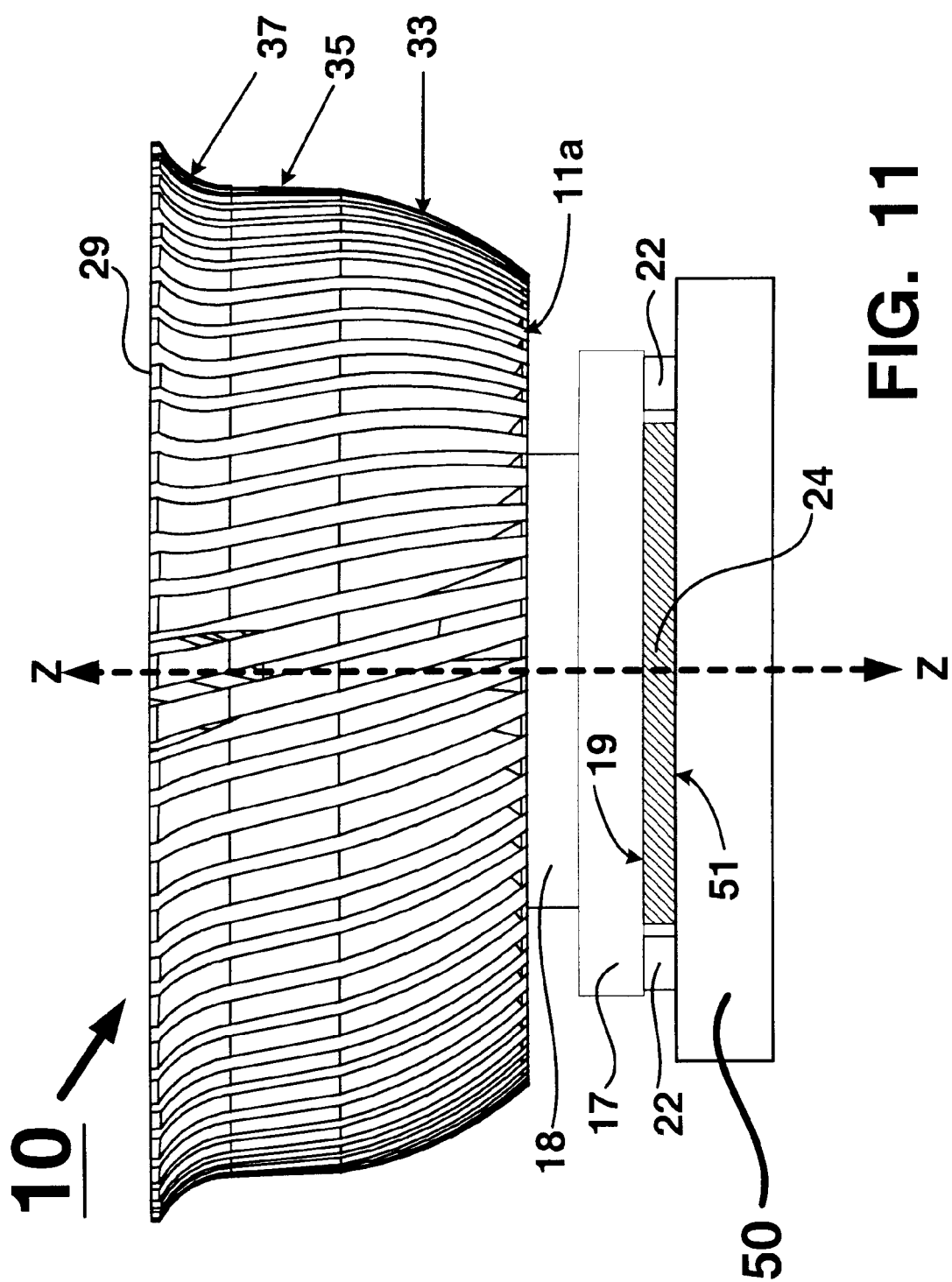
FIG. 11 is a side view of a cooling device with a base having projections and a thermal interface material according to the present invention.

In another embodiment of the present invention as illustrated in FIGS. 1, 4, and 11, the base 17 of the cooling device 10 includes at least two projections 22 that extend outward of the mounting surface 19. A thermal interface material 24 is positioned between the projections 22 and is in contact with the mounting surface 19. The projections 22 protect the thermal interface material 25 from damage when the base 17 is in contact with a component 50 or from damage during manufacturing, transit, and handling. The thermal interface material 24 is in contact with a component face 51 of the component 50 and the thermal interface material 24 provides a thermally conductive path for waste heat from the component face 51 to be communicated through the base 17 and into the heat mass 11. The projections 22 prevent the thermal interface material 24 from being crushed, deformed, or otherwise damaged by mounting the cooling device 10 on the component 50 and/or during manufacturing, transit, and handling. The projections 22 can extend outward of the mounting surface 19 by a distance $d_p$ (see FIG. 1) from about 0.2 millimeters to about 1.0 millimeters. Preferably, the mounting surface 19 is a substantially planar surface (i.e. it is substantially flat) and the mounting surface 19 is substantially perpendicular to the axis Z—Z (i.e. about 90.0 degrees, see angle α in FIG. 10).

Additionally, the thermal interface material 24 seals micro voids (i.e. gaps) between the mounting surface 19 and the component face 51 thereby enhancing thermal transfer from the component 50 to the cooling device 10. Suitable materials for the thermal interface material 24 include but are not limited to a thermally conductive paste, a thermally conductive grease, silicone, paraffin, a phase transition material, graphite, a coated aluminum foil, and carbon fiber. The thermal interface material 24 can be screen printed or pasted to the mounting surface 19, for example.

Figure 12B:
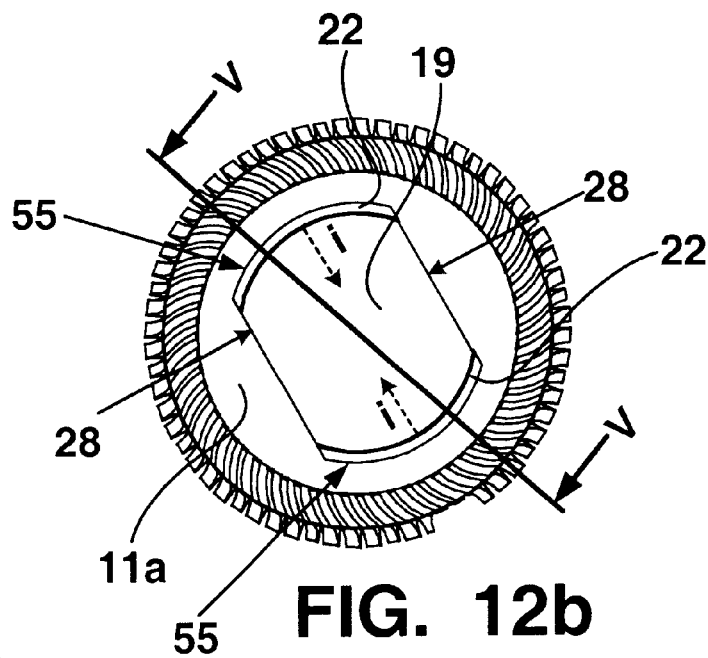
FIGS. 12a through 12d are various views of a cooling device with a base having projections and flats according to the present invention.
Figure 12C:
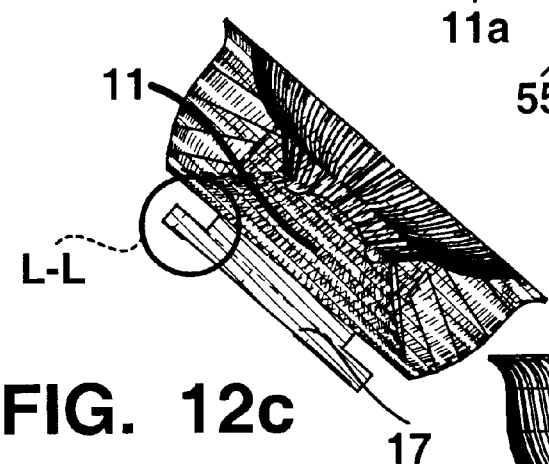
Figure 12A:
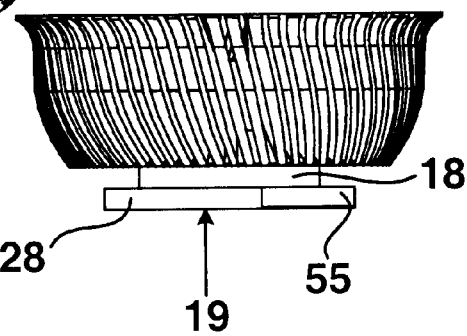
Figure 12D:
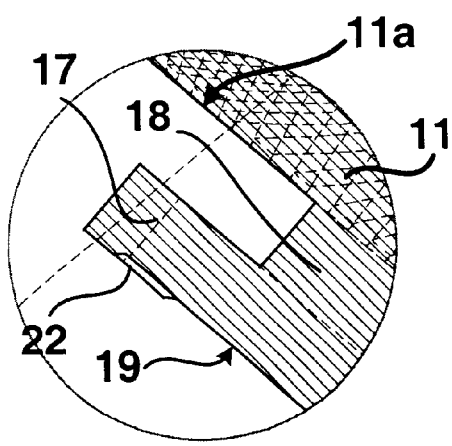

In FIGS. 4 and 12a through 12d, the base 17 can include a cylindrical neck 18 that is inset (see reference numeral 18a) from the base 17 to define an attachment groove 18g between the base 17 and the heat mass 11. The base 17 can also include a pair of flats 28 that are positioned substantially perpendicular to the mounting surface 19 and positioned in parallel opposition to each other. In FIGS. 12a and 12b, the base 17 can have a cylindrical or elliptical shape 55 with the flats 28 formed on opposing sides of the base 17 (see FIG. 12b). The aforementioned projections 22 can have an arcuate shape that complements the cylindrical shape 55; however, the projections 22 can have any shape including a linear shape. The flats 28 can be formed using conventional machining processes such as milling, for example. The projections 22 can be positioned proximate the edges of the base 17 as shown in FIGS. 12b and 12d, or the projections 22 can be inset (see dashed arrows i) from the edges as illustrated in FIG. 12b and FIG. 1.

FIG. 12d is an enlarged view of a section L—L of FIG. 12c illustrating the base 17, cylindrical neck 18, and the projections 22. The projections 22 extend slightly outward of the mounting surface 19; however, the distance $d_p$ for the projections 22 will depend on factors including the thickness of the thermal interface material 24.

Figure 13:
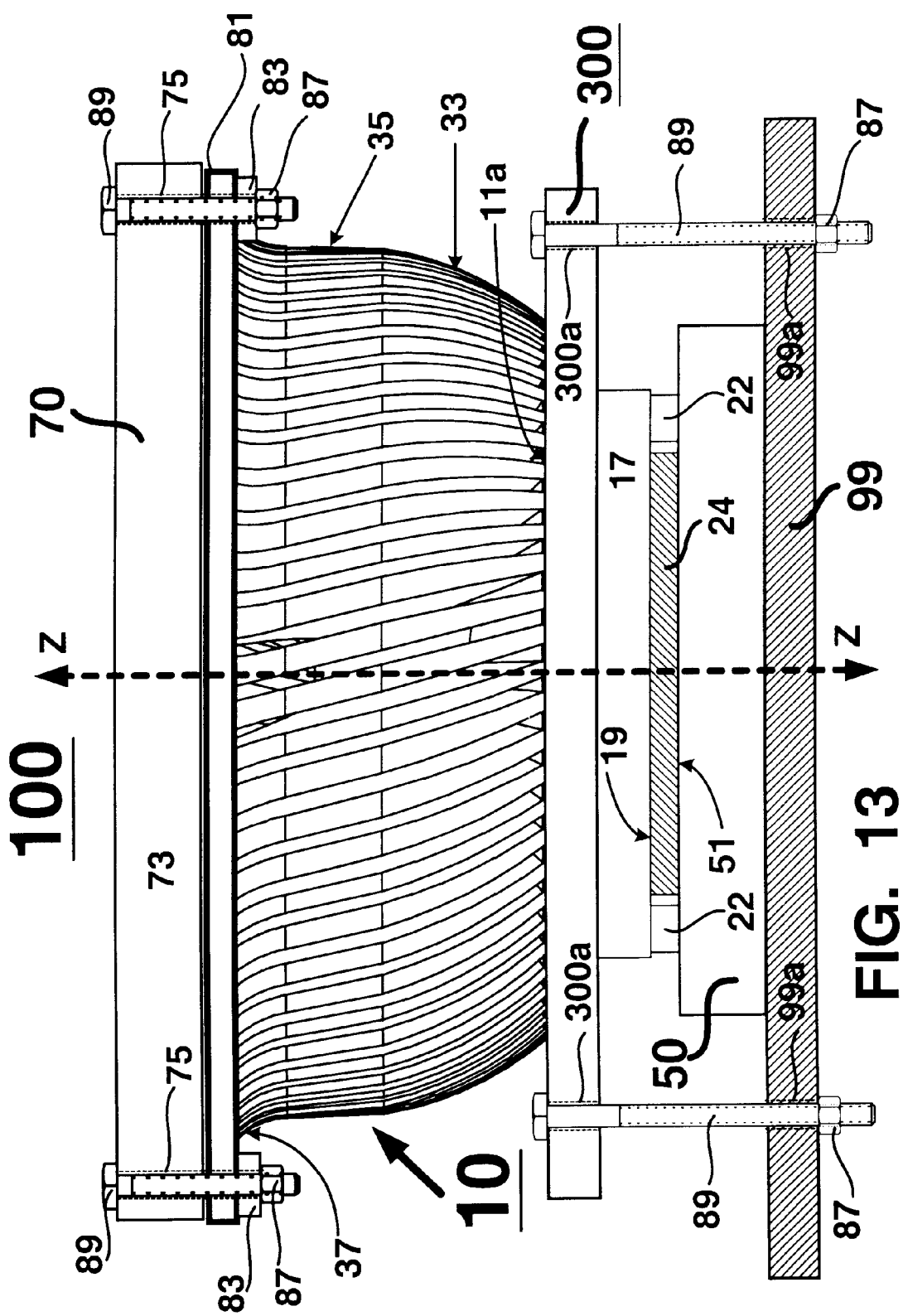
FIG. 13 is a side view of a system for dissipating heat according to the present invention.

In FIG. 13, a system for dissipating heat 100 includes the cooling device 10 as described above, a fan 70 connected with the top face 29 as described above, a component 50 to be cooled by the cooling device 10, and a base mount 300. A component face 51 of the,component 50 is in contact with the mounting surface 19, or as described above in reference to FIG. 11, a thermal interface material 24 may be positioned intermediate between the component face 51 and the mounting surface 19. In either case, waste heat is thermally communicated through the component face 51 into the base 17 either by direct contact between the component face 51 and the mounting surface 19 or via the thermal interface material 24. The base mount 300 urges the mounting surface 19 and the component face 51 into contact with each other so that heat from the component is thermally communicated into the cooling device 10.

In one embodiment of the present invention, the mounting surface 19 of the cooling device 10 includes the projections 22 that extend outward of the mounting surface 19 and the thermal interface material 24 is positioned intermediate between the projections 22 as described above in reference to FIG. 11.

In another embodiment of the present invention, the base 17 of the cooling device 10 includes the cylindrical neck 18 that is inset 18a from the base 17 to define the attachment groove 18g and the flats 28 as was previously described in reference to FIGS. 4 and 12a through 12d above. In yet another embodiment of the present invention, the mounting surface 19 includes the projections 22 and the thermal interface material 24 as described above.

In another embodiment of the present invention, the component 50 is carried by a support unit 99. The support unit includes but is not limited to a socket, a substrate, and a PC board. The socket can be mounted to a PC board in a manner that is well understood in the electronics art. For instance the component can be a micro processor that is inserted into a socket that is solder onto a PC board. The base mount 300 is removably connected with the support unit 99. On the other hand, the support unit can be a PC board on which the component 50 is soldered or otherwise electrically connected with. Although the present invention has described the cooling device 10 in terms of its usefulness in dissipating waste heat from electronic components, the cooling device 10 and the system 100 are not to be construed as being limited to cooling electronic devices exclusively. Accordingly, the component 50 can be any heat generating device from which it is desirable to remove heat. To that end, the support unit 99 need not be a PC board or a socket. The support unit 99 can be a substrate that carries the component 50. The component 50 may or may not be in electrical communication with the substrate.

In FIG. 13, the base mount 300 is a base plate such as the type used for mounting a heat sink to a PC board. A plurality of holes 300a formed in the base mount 300 and a plurality of holes 99a formed in the support unit 99 receive fasteners (87, 89) that removably connect the base mount 300 with the support unit 99. Although a nut and bolt are shown, other fasteners and other fastening methods can be used to removably connect the base mount 300 with the support unit 99.

Figure 14:
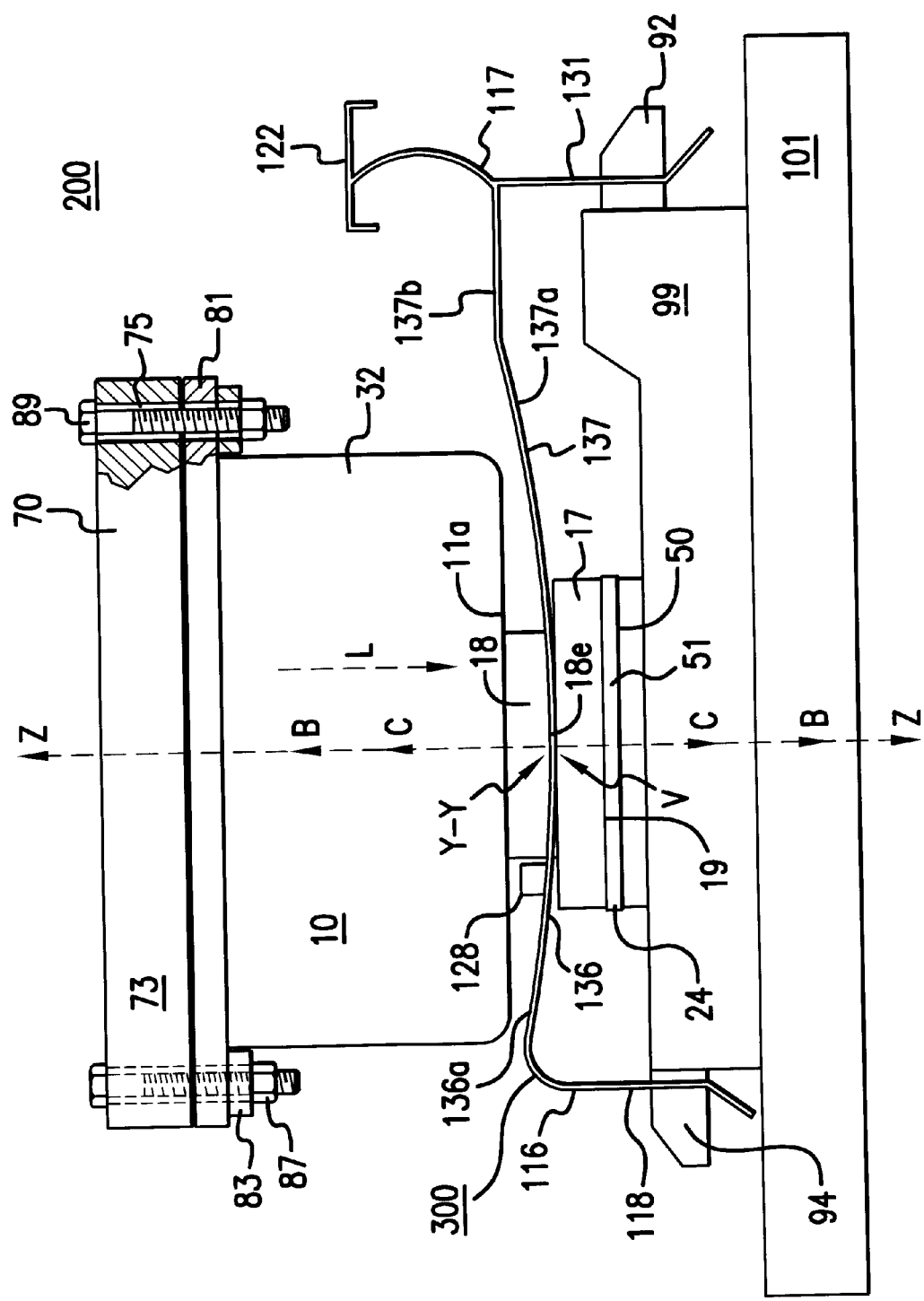
FIG. 14 is a side view of a system for dissipating waste heat according to the present invention.

In FIG. 14, a system 200 includes the cooling device 10, the component 50, the fan 70, and the support unit 99 that carries the component 50. The base mount 300 is a spring clip including a handle 122 for latching and unlatching the spring clip from the support unit 99 that carries the component 50. In FIG. 14, the support unit 99 is a socket such as a zero insertion force socket, for example. The spring clip includes a hinge end 116 and a latch 117. The hinge end 116 includes a hinge 118 that can be removably hinged on a tab 94 connected with the support unit 99 and the latch end 117 includes a latch 131 that can be removably latched onto a tab 92 also connected with the support unit 99. The support unit 99 can be mounted on a PC board 101.

The spring clip includes a pair of ribs (see reference numerals 114, 115 in FIGS. 15b and 15c) that include latch arms 137 and hinge arms 136 that have a vertex V at a rocking axis Y—Y. The rocking axis Y—Y is colinear with a load axis B—B of the spring clip. The hinge arm 136 has a portion 136a that is inclined at an angle relative to a base plane (not shown) through the vertex V and the latch arm 137 has two portions 137a and 137b that are also inclined at an angle with respect to the vertex. Those angles result in a load L being applied substantially along the load axis B—B when the spring clip is latched as shown in FIG. 14. The load L is also substantially colinear with the axis Z—Z and with a component axis C—C of the component 50. Preferably the component axis C—C is at a center of the component 50 so that the load L acts substantially at the center of the component.

Figure 15A:
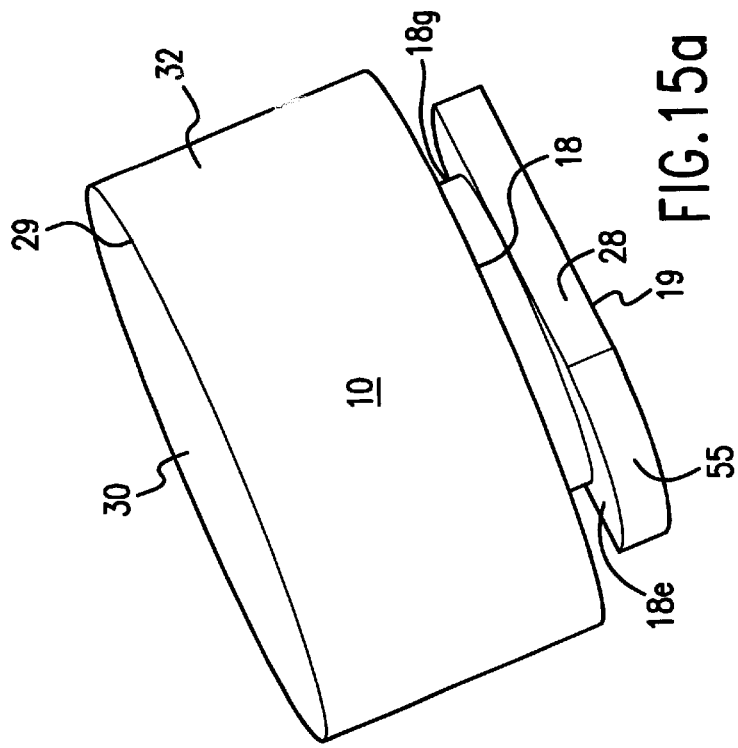
FIGS. 15a through 15c illustrate insertion of a cooling device into a spring clip according to the present invention.
Figure 15C:
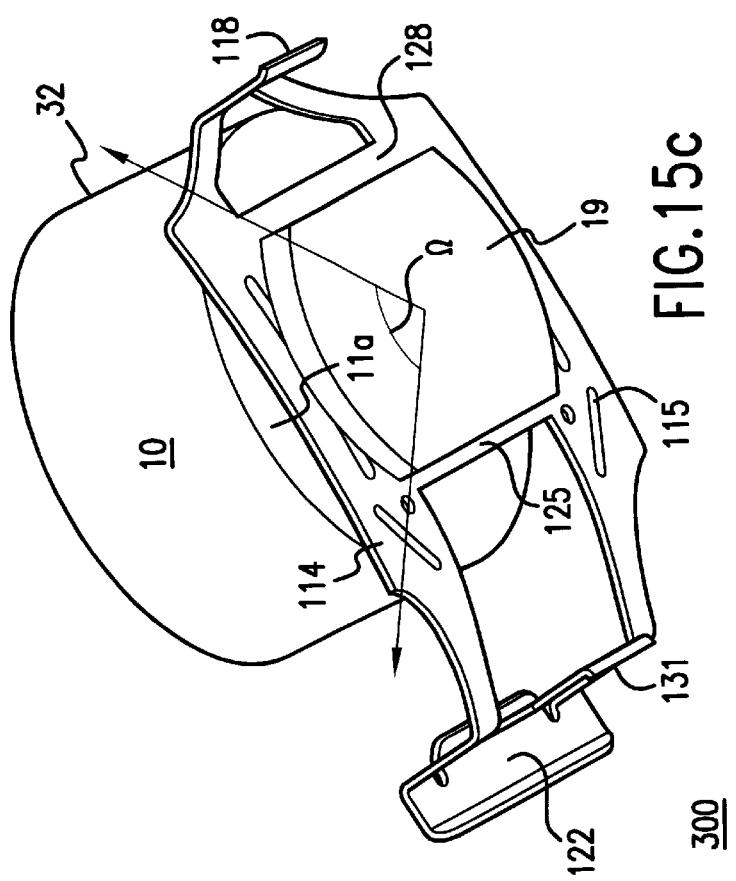
Figure 15B:
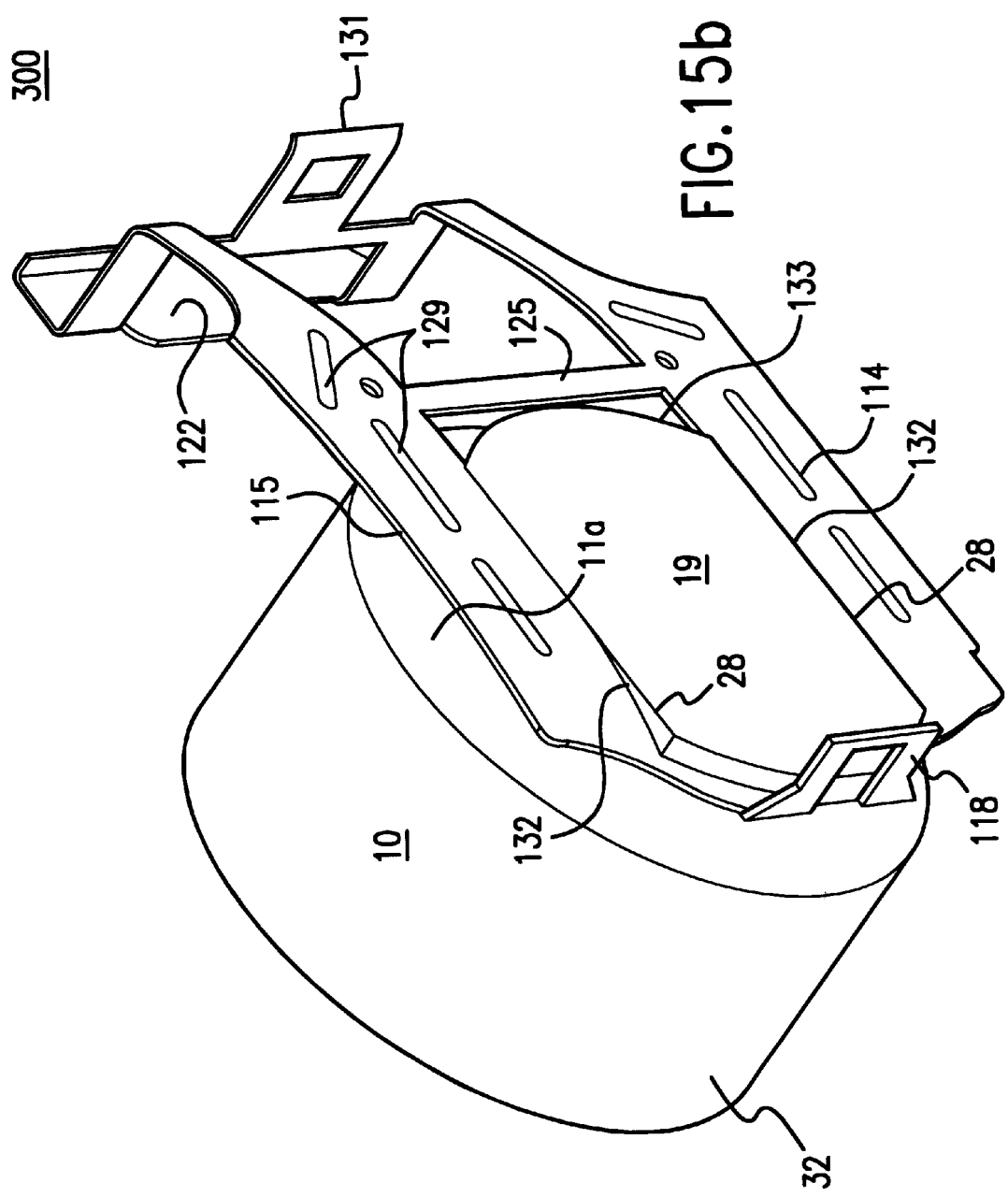

FIGS. 15a through 15c illustrate insertion of the cooling device 10 into the spring clip which is denoted as reference numeral 300. In FIGS. 15a and 15b the flats 28 of the cooling device 10 are aligned with inside edges 132 of the ribs (114, 115) and then the base 17 is inserted through an opening 133 between the ribs (114, 115) until the attachment groove 18g of the cylindrical neck 18 is between the ribs (114, 115). Next, the cooling device 10 is rotated as illustrated by angle Ω in FIG. 15c. For example, the angle Ω can be about 90.0 degrees. Now, the flats 28 are substantially perpendicular to the ribs (114, 115) and are positioned below the ribs (114, 115) so that the rocking axis Y—Y rests on an upper surface 18e of the base 17. Next, a locking rib 128 is inserted into a set of notches (not shown) on the ribs (114, 115) of the hinge end 116. After insertion, the locking rib is substantially parallel to the rocking axis Y—Y and the locking rib 128 rests against one of the flats 28 so that the cooling device 10 cannot be rotated out of the spring clip 300.

Finally, the hinge 118 is inserted over the tab 94 and the latch 131 is latched onto the tab 92 of the support unit 99 thereby placing the mounting surface 19 in contact with the component face 51. With the spring clip 300 latched to the support unit 99, the load L exerted by the spring clip 300 acts along the load axis B—B. Preferably, the load axis B—B, the component axis C—C, and the axis Z—Z of the cooling device 10 are colinear with one another.

Ideally, the component face 51 and the mounting surface 19 are substantially planar (i.e they are flat) and the component 50 is mounted substantially level in the support unit 99; however, due to manufacturing processes there can be deviations from a substantially planar surface, the component 50 may not be level, and thermally induced dimensional changes in any of the aforementioned elements of the system 200 can cause deviations from the ideal. The ribs (114, 115) at the rocking axis have an arcuate surface shape that allows the cooling device 10 some freedom of movement while exerting the load L along the load axis B—B. Therefor, the aforementioned deviations are compensated for by not rigidly fixing the cooling device 10 within the spring clip 300. Additionally, the ribs (114, 115) can include one or more embossed features 129 that also allow the cooling device some freedom of movement within the spring clip 300. The embossed features 129 are urged into contact with the upper surface 18e when the spring clip 300 is latched to the support unit 99.

Removal of the cooling device 10 is the opposite of insertion. The spring clip 300 is unlatched from the support unit 99 by using the handle 122 to unlatch the latch 131 from the tab 92 and pivoting the spring clip 300 to disconnect the hinge 118 from the tab 94. Next, the locking rib 128 is removed from the spring clip 300 freeing the base 17 to rotate. The base 17 is then rotated until the flats 28 are substantially parallel to the inside edges 132 and then the base 17 is pulled out of the opening 133.

The spring clip 300 is described in applicants Pending U.S. Utility Patent Application Ser. No. 09/916,477 entitled "SPRING CLIP FOR A COOLING DEVICE", filed on Friday, Jul. 27, 2001 and assigned to the assignee of the present application. The above mentioned Pending application is incorporated herein by reference as though set forth in its entirety.

The systems (100, 200) can include the projections 22 on the mounting surface 19 and the thermal interface material 24 as was described above in reference to FIG. 11. The thermal interface material 24 can be connected with the mounting surface 19, the component face 51, or both prior to latching the spring clip 300 to the support unit 99 or prior to mounting the base plate of FIG. 13 to the support unit 99.

In one embodiment of the present invention, the systems (100, 200) can include a shroudless fan 74 as was described above in reference to FIG. 10. The fan 74 includes the space frame 90 for supporting the fan 74 and for positioning the fan 74 adjacent to the top face 29 and over the chamber 30 so that the air flow af enters the chamber 30. As previously mentioned, the space frame 90 includes a plurality of arms 91 that span the width of the top face 29 and fingers 93 on the arms 91 clamp the space frame 90 to the smooth radially outward portion 37 of the outer wall 32.

Preferably, the heat mass 11, the base 17, and the vanes 21 are homogeneously formed. An extrusion process can be used to homogeneously form the heat mass 11, the base 17, and the vanes 21. The cooling device 10 can be made from a variety of thermally conductive materials including but not limited to copper, electrolytic copper, aluminum, and alloys of aluminum and copper, ceramics, and silicon (Si) substrates. An exemplary material for the cooling device 10 is aluminum 1060 or aluminum 6063.

The cooling device 10 can be manufactured by a variety of processes including but not limited to those listed below. First, the cooling device 10 can completely machining from an extruded bar stock. Second, a diecasting, forging, or pressing process can be used to form either one or both of the internal and external features (26, 32) of the cooling device 10, followed by a machining process to form the base 17, the mounting surface 19, the projections 22, the cylindrical neck 18, and the attachment groove 18g. Next cutting wheels can be used to form the primary P and secondary S slots for the vanes 21 and the fins 23 respectively, followed by deburring and degreasing. Third, impact forging the complete cooling device 10 including the vanes 21 and fins 23. Fourth, pressure diecasting the complete cooling device 10 including the vanes 21 and fins 23.

An exemplary model of the cooling device 10 was created with a diameter of 65 mm at the top face 29 and a diameter of 50 mm at the bottom surface 11a of the heat mass 11. The base 17 had a diameter of 40 mm and height of 6.5 mm from the bottom surface 11a. The cooling device 10 had a total height from the mounting surface 19 to the top face 29 of about 33 mm. The heat mass 11 had a total height of about 22 mm from the mounting surface 19 to a top of the boss 13. The smooth curved portion 33 had a radius of about 33 mm and the draft portion 35 had a diameter of about 63 mm. A Delta fan, model number EFB0612HA, and having dimensions of 60 mm×60 mm×10 mm in length, breadth, and height was mounted to the cooling device 10 as illustrated in FIG. 14. The cooling device 10 was then mounted on a processor carried by a PGA 370 connector that was soldered onto a mother board. The processor had a top surface of approximately 9 mm×11 mm and a thermal output of 36 watts. The cooling device 10 as described in this paragraph was capable of maintaining the case temperature of the processor at 38.0 degrees Celsius at an ambient temperature of 25.0 degrees Celsius. Based on the above temperatures, a temperature difference of 13.0 degrees Celsius for 36 watts of thermal power results in an estimated thermal resistance for the cooling device 10 of 0.3611 degrees Celsius per watt (13.0 degrees Celsius /36 watts =0.3611).

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
   a heat mass including a boss having a convex arcuate surface profile and a groove surrounding the boss and having a concave arcuate surface profile, the groove and the boss are symmetrically positioned about an axis of the heat mass;
   a heat conductive base in contact with the heat mass and including a mounting surface adapted to contact the component;
   a plurality of vanes in contact with the heat mass and spaced apart to define a primary slot therebetween and extending to the heat mass, the vanes have a surface area that increases in a radially outward direction from the axis,
   the vanes including a top face, an aerodynamically profiled inner wall including a first portion extending from the groove and terminating at a second portion that extends to the top face, the inner walls of the vanes defining a chamber that surrounds the groove, an outer wall having a surface profile that widens from a bottom of the heat mass to the top face and includes therebetween a smooth curved portion, a draft portion, and a smooth radially outward portion, and
   the vanes including at least one secondary slot extending through a portion of each vane to define a plurality of fins in each vane; and
   wherein an air flow entering the chamber exits through the primary slots and a bottom portion of the secondary slots in an exhaust flow that dissipates heat from the vanes and the fins, the exhaust flow creates a low pressure region within the chamber that induces an intake flow into the chamber through the secondary slots and a top portion of the primary slots thereby dissipating heat from the fins and the vanes, and the low pressure region induces a surface flow along the first and second portions of the inner wall so that the surface flow passes over the groove and the boss to dissipate heat from the heat mass.

2. The cooling device as set forth in claim 1 wherein the heat mass, the base, and the vanes are homogeneously formed.

3. The cooling device as set forth in claim 1 wherein the mounting surface is substantially perpendicular to the axis.

4. The cooling device as set forth in claim 1 wherein the mounting surface further comprises:
   a plurality of projections that extend outward of the mounting surface; and
   a thermal interface material in contact with the mounting surface and positioned between the projections, and
   wherein the projections are adapted to protect the thermal interface material from damage when the base is in contact with the component.

5. The cooling device as set forth in claim 1 and further comprising at least one fan positioned adjacent to the top face and positioned over the chamber so that an air flow generated by the fan produces the air flow into the chamber.

6. The cooling device as set forth in claim 5 and further comprising a mounting ring adapted to abut against the smooth radially outward portion and including a plurality of mounting fixtures adapted to receive a fastener that connects the fan with the mounting ring such that the fan is fixedly connected with the top face.

7. The cooling device as set forth in claim 6 wherein at least a portion of the top face is a substantially planar portion and the fan is seated on the substantially planar portion when the fan is connected with the top face.

8. The cooling device as set forth in claim 1 wherein the vanes are tangentially oriented to a predetermined diameter of a circle centered about the axis.

9. The cooling device as set forth in claim 8 where in the predetermined diameter is from about 3.0 millimeters to about 12.0 millimeters.

10. The cooling device as set forth in claim 1 wherein the vanes are inclined at an angle with respect to the axis.

11. The cooling device as set forth in claim 10 wherein the angle at which the vanes are inclined is from about 5.0 degrees to about 25.0 degrees.

12. The cooling device as set forth in claim 10 wherein the angle at which the vanes are inclined comprises a first angle from about 10.0 degrees to about 25.0 degrees, the first angle measured along the smooth radially outward portion, and a second angle from about 5.0 degrees to about 18.0 degrees measured along the smooth curved portion.

13. The cooling device as set forth in claim 1 wherein the arcuate surface profile of the boss is a profile selected from the group consisting of a sphere, a cone, and a frustum of a cone.

14. The cooling device as set forth in claim 1 wherein the arcuate surface profile of the groove is a semi-circular profile.

15. The cooling device as set forth in claim 1 wherein the primary slot further includes a first arcuate profile along the heat mass and the first arcuate profile is a portion of an arc having a radius from about 38.0 millimeters to about 45.0 millimeters.

16. The cooling device as set forth in claim 1 wherein the secondary slot extends to the heat mass and the secondary slot further includes a second arcuate profile along the heat mass and the second arcuate profile is a portion of an arc having a radius from about 31.0 millimeters to about 38.0 millimeters.

17. The cooling device as set forth in claim 1 wherein the first portion of the inner wall is a sloped surface and the second portion of the inner wall is a concave arcuate surface.

18. The cooling device as set forth in claim 1 wherein the base further comprises:
   a cylindrical neck inset from the base and defining an attachment groove between the base and the heat mass; and
   a pair of flats substantially perpendicular to the mounting surface and positioned in parallel opposition to each other.

19. The cooling device as set forth in claim 1 and further comprising:
   a shroudless fan including a space frame for supporting the fan and for positioning the fan adjacent to the top face and over the chamber so that an air flow generated by the fan produces the air flow into the chamber,
   the space frame including a plurality of arms that span the top face, the arms include fingers at an end thereof, and the fingers are adapted to clamp the space frame to the smooth radially outward portion of the outer wall.

20. A system for dissipating heat, comprising:

a cooling device including:

a heat mass including a boss having a convex arcuate surface profile and a groove surrounding the boss and having a concave arcuate surface profile, the groove and the boss are symmetrically positioned about an axis of the heat mass, a heat conductive base in contact with the heat mass and including a mounting surface adapted to contact the component, a plurality of vanes in contact with the heat mass and spaced apart to define a primary slot therebetween and extending to the heat mass, the vanes have a surface area that increases in a radially outward direction from the axis, the vanes including a top face, an aerodynamically profiled inner wall including a first portion extending from the groove and terminating at a second portion that extends to the top face, the inner walls of the vanes defining a chamber that surrounds the groove, an outer wall having a surface profile that widens from a bottom of the heat mass to the top face and includes therebetween a smooth curved portion, a draft portion, and a smooth radially outward portion, and the vanes including at least one secondary slot extending through a portion of each vane to define a plurality of fins in each vane, and wherein an air flow entering the chamber exits through the primary slots in an exhaust flow that dissipates heat from the vanes and the fins, the exhaust flow creates a low pressure region within the chamber that induces an intake flow into the chamber through the secondary slots thereby dissipating heat from the fins, and the low pressure region induces a surface flow along the first and second portions of the inner wall so that the surface flow passes over the groove and the boss to dissipate heat from the heat mass;

a fan for generating the air flow into the chamber, the fan connected with the top face;

a component including a component face; and a base mount for urging the mounting surface and the component face into contact with each other so that heat generated by the component is thermally communicated into the cooling device.

21. The system as set forth in claim 20 wherein the component is carried by a support unit selected from the group consisting of a socket, a substrate, and a PC board, and the base mount is removably connected with the support unit.

22. The system as set forth in claim 20 wherein the mounting surface further comprises:

a plurality of projections that extend outward of the mounting surface; and a thermal interface material in contact with the mounting surface and the component face and positioned between the projections, and wherein the projections are adapted to protect the thermal interface material from damage when the mounting surface is in contact with the component face.

23. The system as set forth in claim 20 wherein the base further comprises:

a cylindrical neck inset from the base and defining an attachment groove between the base and the heat mass; and a pair of flats substantially perpendicular to the mounting surface and positioned in parallel opposition to each other.

24. The system as set forth in claim 23 wherein the mounting surface further comprises:

a plurality of projections that extend outward of the mounting surface; and a thermal interface material in contact with the mounting surface and the component face and positioned between the projections, and wherein the projections are adapted to protect the thermal interface material from damage when the mounting surface is in contact with the component face.

25. The system as set forth in claim 20 wherein the fan is a shroudless fan including a space frame for supporting the fan and for positioning the fan adjacent to the top face and over the chamber so that the air flow generated by the fan produces the air flow into the chamber, the space frame including a plurality of arms that span the top face, the arms include fingers at an end thereof, and the fingers are adapted to clamp the space frame to the smooth radially outward portion of the outer wall.

* * * * *